(12) United States Patent
Chen et al.

(10) Patent No.: US 12,408,349 B2
(45) Date of Patent: Sep. 2, 2025

(54) FERROELECTRIC TUNNEL JUNCTIONS WITH CONDUCTIVE ELECTRODES HAVING ASYMMETRIC NITROGEN OR OXYGEN PROFILES

(71) Applicant: Taiwan Semiconductor Manufacturing Company, Ltd., Hsinchu (TW)

(72) Inventors: Yi-Hsuan Chen, Taoyuan (TW); Kuo-Ching Huang, Hsinchu (TW); Kuen-Yi Chen, Taoyuan (TW); Yi Ching Ong, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 578 days.

(21) Appl. No.: 17/834,939

(22) Filed: Jun. 8, 2022

(65) Prior Publication Data

US 2023/0403862 A1 Dec. 14, 2023

(51) Int. Cl.
*H10B 53/30* (2023.01)
(52) U.S. Cl.
CPC .................................. *H10B 53/30* (2023.02)

(58) Field of Classification Search
CPC ...... H10B 53/30; H10B 51/30; H10D 64/033; H10D 64/689; H10N 70/826; H10N 70/841
See application file for complete search history.

(56) References Cited

U.S. PATENT DOCUMENTS

| 2014/0169061 | A1* | 6/2014 | Bibes | G11C 11/22 |
| | | | | 257/295 |
| 2015/0380641 | A1* | 12/2015 | Ino | C01G 25/02 |
| | | | | 257/295 |
| 2021/0066448 | A1* | 3/2021 | Chang | H10B 53/30 |
| 2023/0011305 | A1* | 1/2023 | Chen | H10B 53/30 |

* cited by examiner

*Primary Examiner* — Bac H Au
(74) *Attorney, Agent, or Firm* — KILPATRICK TOWNSEND & STOCKTON LLP

(57) ABSTRACT

A semiconductor device includes a ferroelectric tunnel junction (FTJ), wherein the ferroelectric tunnel junction includes a first electrode, a ferroelectric layer disposed over the first electrode, and a second electrode disposed over the ferroelectric layer. The first electrode contains nitrogen or oxygen and is characterized by a first percentage of nitrogen or oxygen. The second electrode contains nitrogen or oxygen and is characterized by a second percentage of nitrogen or oxygen. The first percentage is different from the second percentage.

20 Claims, 16 Drawing Sheets

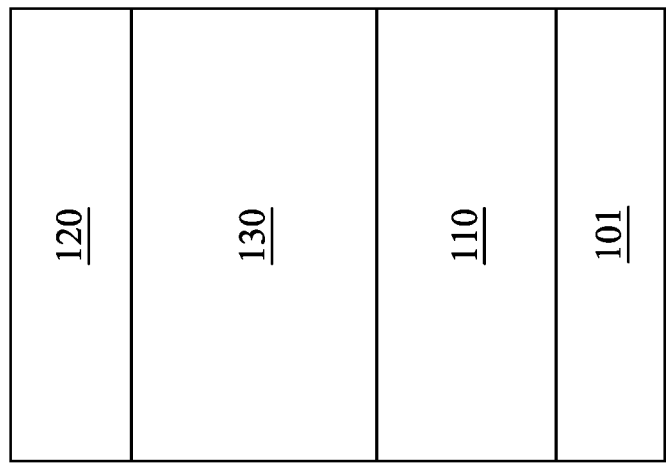

| Non-polar layer location | O profile @ TE | O profile @ BE | Read voltage polarity |
|---|---|---|---|
| @ TE | 10%~15% | 25%~30% | +ve |
| @ TE | 25%~30% | 10%~15% | -ve |
| @ BE | 10%~15% | 25%~30% | +ve |
| @ BE | 25%~30% | 10%~15% | -ve |

FIG. 10

FERROELECTRIC TUNNEL JUNCTIONS WITH CONDUCTIVE ELECTRODES HAVING ASYMMETRIC NITROGEN OR OXYGEN PROFILES

BACKGROUND

Volatile memory stores data while it is powered, while non-volatile memory is able to store data when power is removed. A ferroelectric random-access memory (FeRAM) device is an attractive non-volatile memory technology. This is because FeRAM devices provide many advantages, including a fast write time, high endurance, low power consumption, and low susceptibility to damage from radiation.

FeRAM devices are based on ferroelectric material, which is characterized by a nonlinear relationship between the applied electric field and the stored charge. Specifically, the ferroelectric characteristic has the form of a hysteresis loop. Semi-permanent electric dipoles are formed in the crystal structure of the ferroelectric material. When an external electric field is applied across the ferroelectric material, the dipoles tend to align themselves with the field direction, produced by small shifts in the positions of atoms and shifts in the distributions of electronic charge in the crystal structure. When the external electric field is removed, the dipoles of the ferroelectric material retain their polarization state.

Even though FeRAM devices are being commercialized, much improvement is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a cross-sectional view illustrating a ferroelectric tunnel junction that can be included in a memory cell of a ferroelectric memory device, in accordance with some embodiments.

FIG. 10 is a table illustrating possible oxygen profiles in a ferroelectric tunnel junction, depending on the location of the interfacial layer, in accordance with some embodiments.

DETAILED DESCRIPTION

Figure 1B:
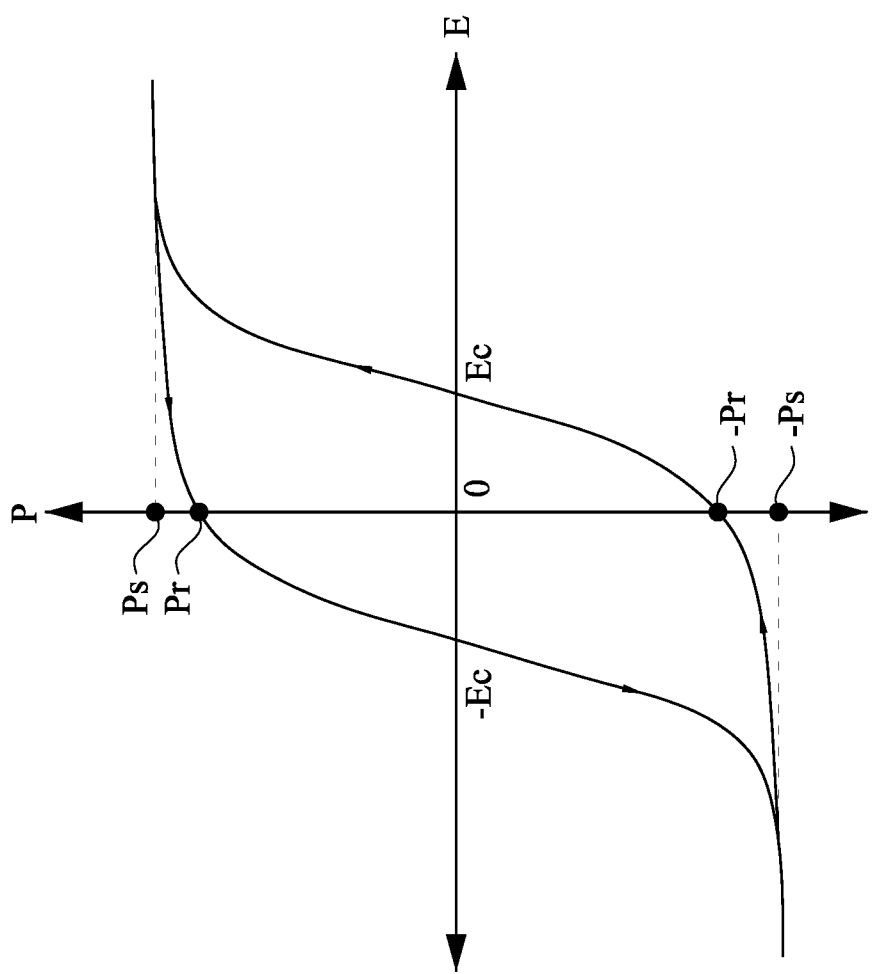
FIG. 1B illustrates a ferroelectric hysteresis loop showing the relationship between the polarization (P) versus electric field (E) of a ferroelectric material.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Typically, a ferroelectric memory device uses a ferroelectric layer, which is composed of a ferroelectric material. Various aspects of device performance (e.g., switching voltage, retention, endurance, etc.) of the ferroelectric memory device are highly dependent on the structure of the ferroelectric tunnel junction. Various embodiments of the disclosure are directed to provide ferroelectric memory devices with enhanced device performance.

Embodiments of the disclosure provide a semiconductor device including a ferroelectric tunnel junction (FTJ), wherein the ferroelectric tunnel junction includes a first electrode, a ferroelectric layer disposed over the first electrode, and a second electrode disposed over the ferroelectric layer. The first electrode contains nitrogen or oxygen and is characterized by a first percentage of nitrogen or oxygen. The second electrode contains nitrogen or oxygen and is characterized by a second percentage of nitrogen or oxygen. The first percentage is different from the second percentage. The percentage of nitrogen or oxygen is adjusted to enhance the device performance of the ferroelectric tunnel junction. In some embodiments, varying the percentage of nitrogen in nitrogen-containing electrodes can lead to a different thickness of interfacial layers adjacent to each electrode, resulting in band bending that enhances tunneling current. In some other embodiments, varying the percentage of oxygen in oxygen-containing electrodes can lead to different work functions of each electrode, resulting in enhancement of tunneling current.

FIG. 1A is a cross-sectional view illustrating a ferroelectric tunnel junction that can be included in a memory cell of a ferroelectric memory device, in accordance with some embodiments. Referring to FIG. 1A, in some embodiments, the ferroelectric tunnel junction 100 is formed on a substrate 101 and includes a ferroelectric layer 130 disposed between a first conductive region 110 and a second conductive region 120. In some embodiments, the first conductive region 110 is a channel region of a transistor and the second conductive region 120 is a gate electrode of the transistor. In some other embodiments, the first conductive region 110 is a lower electrode connected to a transistor, and the second conductive region 120 is an upper electrode over the lower electrode. In some cases, the lower electrode is also referred to as the bottom electrode (BE), and the upper electrode is also referred to as the top electrode (TE). In some embodiments, other components (e.g., dielectric features) may be disposed between the ferroelectric layer 130 and the first conductive region 110, and/or between the ferroelectric layer 130 and the second conductive region 120. The ferroelectric layer 130 includes one or more of ferroelectric materials.

FIG. 1B illustrates a ferroelectric hysteresis loop showing the relationship between the polarization (P) versus electric field (E) of a ferroelectric material. Referring to FIG. 1B, as the electric field increased from zero to a positive value, the overall polarization of the ferroelectric material increases as the polarization in different dipolar regions (domains) are aligned with the electric field. Eventually, the total polarization of the field reaches a saturation point where the polarization is not further increased as the electric field increases since all domains are aligned in the same direction. The saturation point is called the saturation polarization (Ps) of the ferroelectric material. When the electric field is reduced to zero (i.e., the electric field is removed), the ferroelectric material retains polarized, and the polarization value at this point is called the remnant polarization (Pr). A negative field will cause the polarization to reduce, until it reaches zero at the coercive field (−Ec). A further negative increase in the electric field will eventually cause a reverse saturation polarization (−Ps) to develop. When the electric field returns to zero, the ferroelectric material is left with a negative remanent polarization (−Pr). Increasing the field once more increases the polarization from −Pr to zero at coercive field Ec, and then to Ps.

Different ferroelectric materials have different properties. For example, the properties may include one or more of the remnant polarization, saturation polarization, coercive field, loop squareness, voltage-pulse time, grain size, the interface property and/or other electrical properties and film growth properties. Herein, the term "loop squareness" refers to the degree of squareness of the hysteresis loop of the ferroelectric material. If the shape of the hysteresis loop is more like a square, the higher the loop squareness. "Voltage-pulse time" refers to the relationship between applied write pulse and required voltage to enable switching.

In some embodiments, the ferroelectric layer 130 in FIG. 1 includes one or more ferroelectric materials selected from hafnium oxide (HfOx) doped with dopant(s) such as Zr, Si, La, AlScN, ZrOx, ZrOxPb3Ge5O11 (PGO), lead zirconatetitanate (PZT), SrBi2Ta2O9 (SBT or SBTO), SrB4O7 (SBO), SraBibTacNbd 0), (SBTN), SrTiO3 (STO), BaTiO3 (BTO), (BixLay)Ti3O12 (BLT), LaNiO3 (LNO), YMnO3, ZrO2, zirconium silicate, ZrAlSiO, HfO2, hafnium silicate, HfAlO, LaAlO, lanthanum oxide, Ta2O5, and/or other suitable ferroelectric material.

In some embodiments, the ferroelectric layer 130 may include hafnium oxide (HfOx) doped with different dopants. The dopants may include various metallic dopants and/or semiconductor dopants. In some embodiments, the dopants may be selected from two or more of La, Zr, Si, Al, or the like and/or other suitable dopants.

Interface property of a ferroelectric material refers to the property of the interface between the ferroelectric material and adjacent material. For example, when a ferroelectric material is disposed adjacent to a metal material, some ferroelectric materials may readily react with the metal material under thermal treatment or the metal is easy to diffuse into the ferroelectric material, which may negatively affect the electrical property of the ferroelectric material. In contrast, some ferroelectric materials do not readily react with metal material under thermal treatment and the metal material is not easy to diffuse into the ferroelectric material.

On the other hand, when a ferroelectric material is disposed adjacent to an insulating material (such as native oxide), if the insulating material readily generates a depolarization filed under the affection of the ferroelectric material, it represents the ferroelectric material has poor interface property. In contrast, if the insulating material does not readily generate a depolarization filed when interfacing with or adjacent to the ferroelectric material, it represents the ferroelectric material has good interface property.

The ferroelectric materials may be formed by suitable deposition processes, such as chemical vapor deposition (CVD), atomic layer deposition (ALD), physical vapor deposition (PVD), or the like or combinations thereof.

The materials of the lower electrode 110 and upper electrode 120 may be respectively selected from a group consisting of aluminum (Al), titanium (Ti), copper (Cu), tungsten (W), platinum (Pt), palladium (Pd), osmium (Os), ruthenium (Ru), tantalum (Ta), or an alloy thereof, titanium nitride (TiN), tantalum nitride (TaN), tungsten nitride (WN), molybdenum nitride (MoN), TaSiN, TiSiN, WSiN, tungsten silicide, titanium silicide, cobalt silicide, zirconium silicide, platinum silicide, molybdenum silicide, copper silicide, nickel silicide, indium tin oxide (ITO), iridium oxide ($IrO_2$), rhenium oxide ($ReO_2$), rhenium trioxide ($ReO_3$), or a combination thereof. The electrodes may be formed by suitable deposition processes, such as chemical vapor deposition (CVD), atomic layer deposition (ALD), physical vapor deposition (PVD), or the like or combinations thereof.

Figure 2:
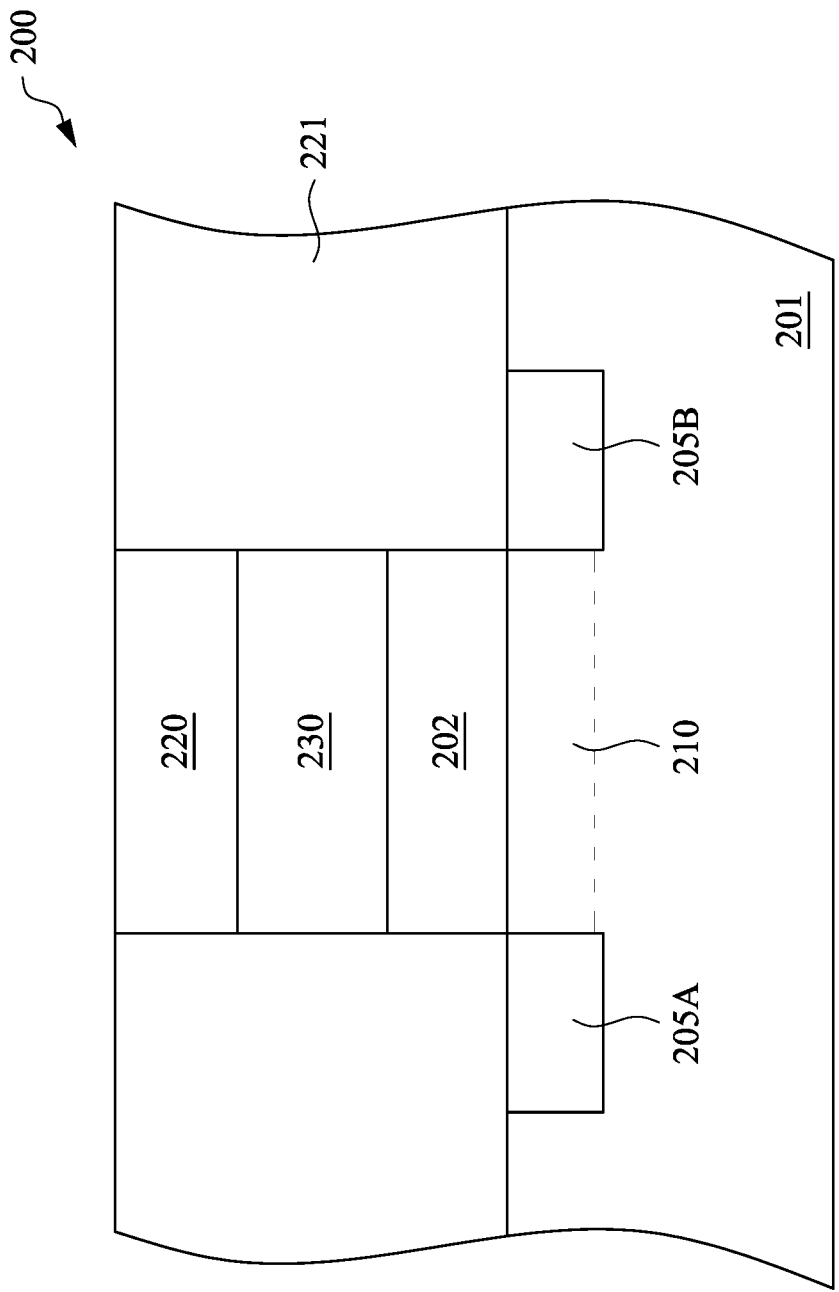
FIG. 2 is a cross-sectional view illustrating a ferroelectric memory device which is a metal-ferroelectric-insulator-semiconductor (MFIS) ferroelectric memory device, in accordance with some embodiments.
Figure 3:
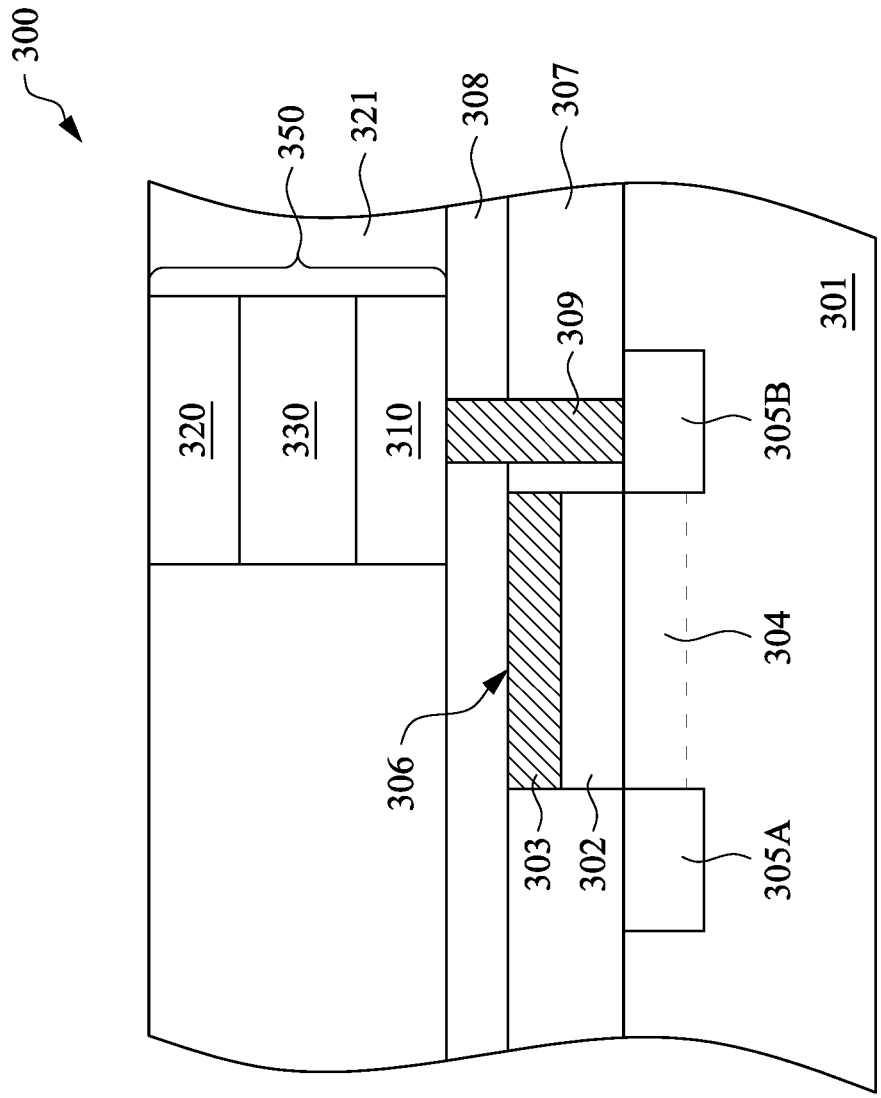
FIG. 3 is a cross-sectional view illustrating a ferroelectric memory device 300 which is a 1 transistor-1 capacitor (1T1C) type ferroelectric memory device, in accordance with some embodiments.

The ferroelectric tunnel junction 100 may be applied in various types of ferroelectric memory devices. FIGS. 2 and 3 are schematic cross-sectional views illustrating memory devices including the ferroelectric tunnel junction 100 according to some embodiments of the disclosure.

FIG. 2 is a cross-sectional view illustrating a ferroelectric memory device 200 which is a metal-ferroelectric-insulator-semiconductor (MFIS) ferroelectric memory device, in accordance with some embodiments. In some embodiments, the ferroelectric memory device 200 is a transistor, and a ferroelectric layer 230 is embedded in the transistor 200. The transistor 200 may also be referred to as ferroelectric field effect transistor (FeFET).

In some embodiments, the ferroelectric memory device 200 includes a substrate 201 The transistor 200 includes an insulating layer 202, a ferroelectric layer 230, and a gate electrode 220 stacked on the substrate 201, and source/drain (S/D) regions 205A and 205B. Source/drain (S/D) regions 205A and 205B are disposed in the substrate 201 and adjacent to a channel region 210. A channel region 210 is formed between the S/D regions 205A and 205B and underlying the gate electrode 220 and ferroelectric structure 230.

In some embodiments, the substrate 201 is made of silicon and/or other semiconductor materials. Alternatively or additionally, the substrate 201 includes other elementary semiconductor materials such as germanium, gallium arsenic, or other suitable semiconductor materials. In some embodiments, the substrate 201 may further include other features such as various doped regions, buried layer(s), and/or epitaxy layer(s). Moreover, in some embodiments, the substrate 201 is made of an alloy semiconductor such as silicon germanium, silicon germanium carbide, gallium arsenic phosphide, or gallium indium phosphide. Furthermore, the substrate 201 may be a semiconductor on an insulator such as silicon on insulator (SOI) or silicon on sapphire.

The insulating layer 202, the ferroelectric layer 230, and the gate electrode 220 are sequentially stacked on the channel region 210 of the substrate 100. In some embodiments, the combination of the insulating layer 202 and the ferroelectric layer 230 may be referred to as a gate dielectric layer. The insulating layer 202 may include silicon oxide, silicon nitride, silicon oxynitride, a high-K dielectric material, or the like, or combinations thereof. The high-k dielectric material may have a dielectric constant such as greater than about 4, or greater than about 7 or 10.

In some embodiments, the high-k dielectric material includes ZrO2, Gd2O3, HfO2, BaTiO3, Al2O3, LaO2, TiO2, Ta2O5, Y2O3, STO, BTO, BaZrO, HfZrO, HfLaO, HfTaO, HfTiO, combinations thereof, or other suitable material. In some embodiments, a native oxide layer (e.g., silicon oxide, not shown) may exist between the insulating layer 202 and the substrate 201. In some other embodiments, the insulating layer 202 is optionally formed and may be omitted. If the insulating layer 202 is omitted, the ferroelectric memory device 200 may be referred to as a metal-ferroelectric-semiconductor (MFS) ferroelectric memory device.

The gate electrode 220 may include polysilicon and/or metallic materials. In some embodiments, the gate electrode 220 includes a work function metal layer and a metal layer on the work function metal layer. The work function metal layer is configured to tune the work function of the transistor to achieve a desired threshold voltage Vt. The work function metal layer may be an N-type work function metal layer or a P-type work function metal layer. In some embodiments, the P-type work function metal layer includes a metal with a sufficiently large effective work function and may include one or more of the following: TiN, WN, TaN, conductive metal oxide, and/or other suitable material, or combinations thereof. In alternative embodiments, the N-type work function metal layer includes a metal with sufficiently low effective work function and may include one or more of the following: tantalum (Ta), titanium aluminide (TiAl), titanium aluminum nitride (TiAlN), tantalum carbide (TaC), tantalum carbide nitride (TaCN), tantalum silicon nitride (TaSiN), titanium silicon nitride (TiSiN), other suitable metals, suitable conductive metal oxide, or combinations thereof. The metal layer may include copper, aluminum, tungsten, cobalt (Co), or any other suitable metallic material, or the like or combinations thereof.

In the present embodiment, the ferroelectric layer 230 is disposed between channel region 210 (i.e., the first conductive region 110 of FIG. 1) and the gate electrode 220. The composition and structural features of the ferroelectric layer 230 have been described above in connection with FIG. 1, and are not repeated here.

The S/D regions 205A and 205B may be doped regions including p-type dopants, such as boron, BF2 P, and/or a combination thereof. Alternatively, the S/D regions 205A and 205B may be doped regions including n-type dopants, such as phosphorus, arsenic, and/or a combination thereof. In some embodiments, the S/D regions 205A and 205B may also include an epitaxial layer (or strained layer).

In some embodiments, the gate stack including the insulating layer 202, the ferroelectric layer 230, and the gate electrode 220 are formed by various deposition processes and patterning processes. The S/D regions 205A and 205B may be formed by the doping process and/or epitaxial process.

In some embodiments, an interlayer dielectric layer (ILD) 221 is disposed on the substrate 201 and covering the transistor. An interconnection structure (not shown) may be disposed over the interlayer dielectric layer 221 and electrically coupled to the transistor. In some embodiments, the ILD 221 is formed after the formation of gate stack.

In the ferroelectric memory device 200, the ferroelectric layer 230 has polarization characteristics in accordance with a voltage applied through the gate electrode 220, and a conductive region (i.e., the channel region 210) is formed between the S/D regions 205A and 205B. As a result, a current flows between the S/D regions 205A and 205B. When the voltage applied through the gate electrode is cut off, the polarization characteristics of the ferroelectric layer 230 is continuously maintained. Therefore, the ferroelectric memory device 200 can function as a nonvolatile memory device.

FIG. 3 is a cross-sectional view illustrating a ferroelectric memory device 300 which is a 1 transistor-1 capacitor (1T1C) type ferroelectric memory device, in accordance with some embodiments. In some embodiments, the ferroelectric memory device 300 in FIG. 3 includes a substrate 301, a transistor 306 disposed on and/or in the substrate 301 and a ferroelectric tunnel junction 350 electrically connected to the transistor 306. The ferroelectric tunnel junction 350 includes a ferroelectric layer 330 disposed between a first conductive region 310 and a second conductive region 320. In some embodiments, the transistor 306 includes a gate dielectric layer 302, a gate electrode 303, a channel region 304, and a source region 305A and a drain region 305B in the substrate 301 and on sides of the gate electrode 303. The ferroelectric tunnel junction 350 is electrically connected to the drain region 305B of the transistor 306 through a conductive plug/via 309. In some embodiments, a first ILD 307 is disposed on the substrate 301 and adjacent the gate electrode 303 and the gate dielectric layer 302. A second ILD 308 is disposed on the first ILD 307 and covering top surface of the gate electrode 303. The conductive plug 309 penetrates through the ILDs 307 and 308 to electrically connect to the drain region 305B of the transistor 306. A dielectric layer 321 may be disposed on the second ILD 308 and laterally adjacent the ferroelectric tunnel junction 350. In some embodiments, the ferroelectric tunnel junction 350 is embedded in an interconnection structure over the transistor 306. In some other embodiments, the ferroelectric tunnel junction 350 may be connected to the drain region 305 through more than one conductive plug and/or conductive lines.

FIGS. 2 and 3 illustrate examples of ferroelectric tunnel junction 100 as part of a non-volatile memory device. However, the applications of the ferroelectric tunnel junction 100 described above are merely for illustration, and the disclosure is not limited thereto. For example, in some other embodiments, the ferroelectric tunnel junction 100 may also be applied in other kinds of ferroelectric devices using ferroelectric materials, such as negative capacitance field effect transistors (NCFET).

FIGS. 4-7 illustrate ferroelectric tunnel junctions (FTJ) and the effect of interfacial layers and electrode composition on the performance of the ferroelectric tunnel junctions, in accordance with some embodiments.

Figure 4:
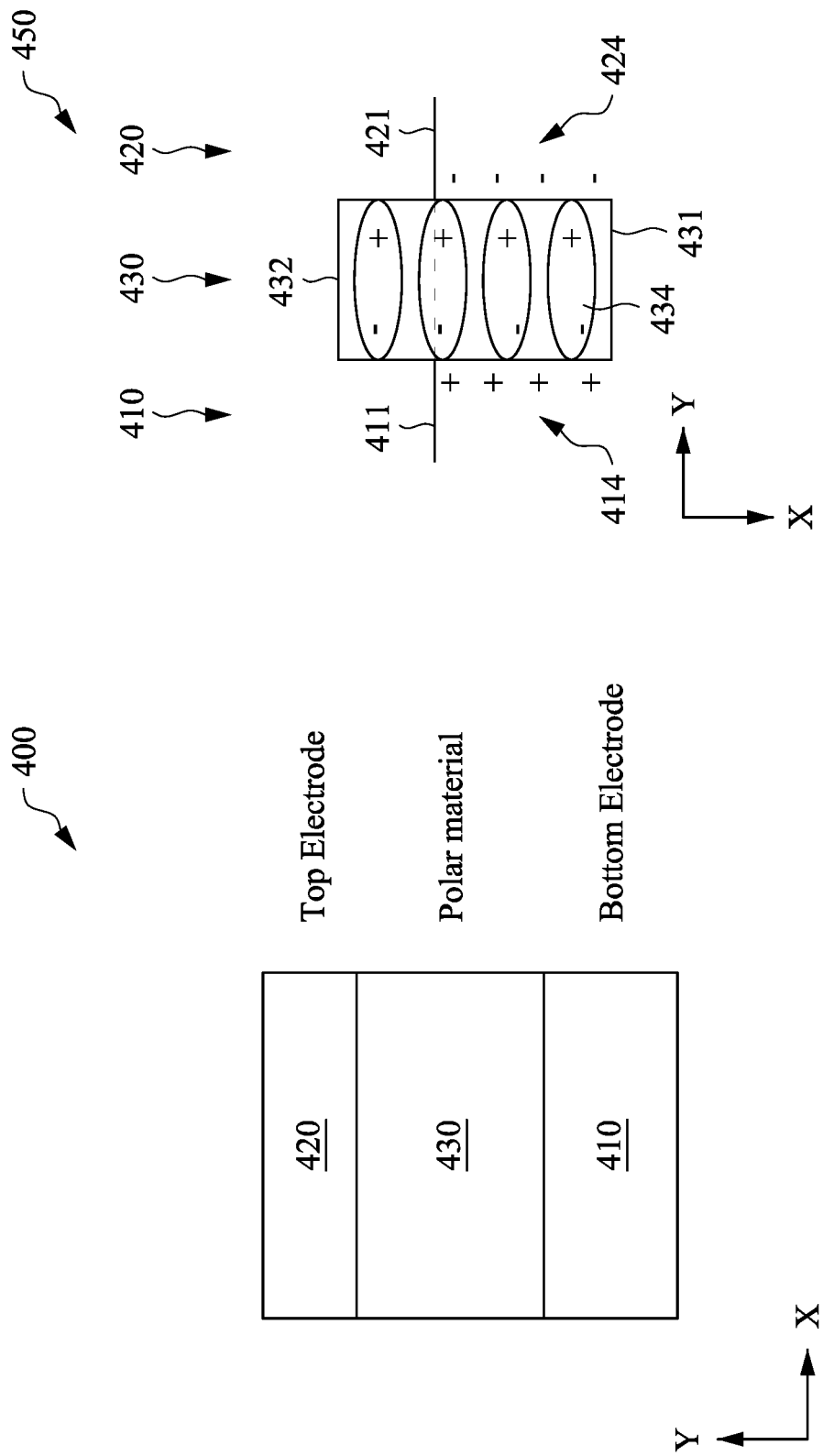
FIG. 4 illustrates a ferroelectric tunnel junction and its band diagrams, in accordance with some embodiments.

FIG. 4 illustrates a ferroelectric tunnel junction and its band diagrams, in accordance with some embodiments. As shown in FIG. 4, a ferroelectric tunnel junction (FTJ) 400 includes a first electrode 410, a ferroelectric layer 430 disposed over the first electrode 410, and a second electrode 420 disposed over the ferroelectric layer 430. The ferroelectric layer includes a ferroelectric material. In some embodiments, the first electrode is also referred to as the bottom electrode (BE), and the second electrode 420 is also referred to as the top electrode (TE). In some embodiments, ferroelectric tunnel junction (FTJ) 400 in FIG. 4 is similar to the ferroelectric tunnel junctions described above in connection with FIGS. 1-3. In some embodiments, the ferroelectric layer 430 includes a ferroelectric material HfZrO. It is understood, however, that other ferroelectric materials can also be used, including those described above in connection with FIGS. 2-3.

In FIG. 4, diagram 450 is an energy band diagram of ferroelectric tunnel junction 400. In FIG. 4, reference numeral 411 indicates the Fermi level of the first electrode 410, reference numeral 421 indicates the Fermi level of the second electrode 420, reference numeral 431 indicates the valence band edge of the ferroelectric layer 430, and reference numeral 432 indicates the conduction band edge of the ferroelectric layer 430. The polarization in the ferroelectric layer 430 produces charge dipoles 434. Further, charges 414 and 424 are induced in the first electrode 410 and the second electrode 420, respectively.

Figure 5:
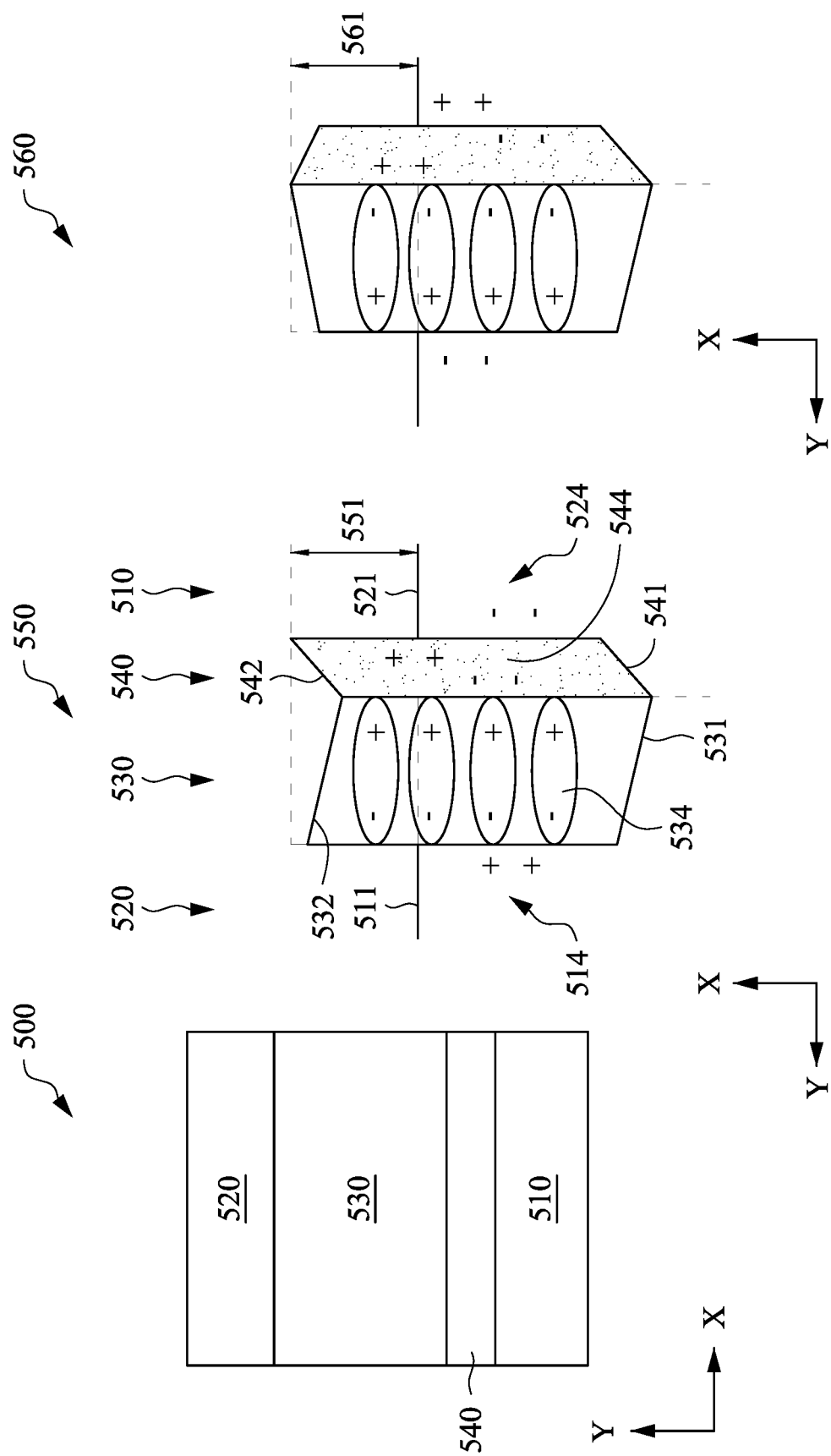
FIG. 5 illustrates another ferroelectric tunnel junction and its band diagrams, in accordance with some embodiments.

FIG. 5 illustrates another ferroelectric tunnel junction and its band diagrams, in accordance with some embodiments. As shown in FIG. 5, a ferroelectric tunnel junction (FTJ) 500 includes a first electrode 510, a ferroelectric layer 530 disposed over the first electrode 510, and a second electrode 520 disposed over the ferroelectric layer 530. The ferroelectric layer includes a ferroelectric material. Ferroelectric tunnel junction (FTJ) 500 also includes an interfacial layer 540 disposed on the first electrode 510, and the ferroelectric layer 530 is disposed on the interfacial layer 540. In some embodiments, the first electrode is also referred to as the bottom electrode (BE), and the second electrode 520 is also referred to as the top electrode (TE).

In some embodiments, ferroelectric tunnel junction (FTJ) 500 is similar to the ferroelectric tunnel junctions described above in connection with FIGS. 1-4. A difference is that an interfacial layer 540 is present between the first electrode 510 and the ferroelectric layer 530. In some embodiments, the interfacial layer is a native oxide or a chemical oxide that forms during device fabrication in exposure to oxygen and/or moisture, and thermal process conditions such as annealing processes. Further, native oxide can form during ex-situ deposition procedure or due to the presence of interfacial oxide due to oxygen scavenging from electrodes. The electrical characteristic of ferroelectric tunnel junctions is often not well controlled due to the presence of native oxide.

When a non-ferroelectric (or non-polar) layer is present next to the ferroelectric film, FTJ behavior is modified, i.e., tunneling current can be modulated by the polarization of the ferroelectric film. Different location of the non-ferroelectric layer will give different FTJ characteristics. When the non-ferroelectric layer locates in-between the top electrode (where bias is applied) and the ferroelectric layer, negative polarization will give higher tunneling current and positive polarization will give lower tunneling current. The trend is reversed if the non-ferroelectric layer locates in-between the bottom electrode and the ferroelectric layer.

Since native oxides can be difficult to control, the method of forming a ferroelectric tunnel junction sometimes includes an additional deposition step to deposit layer of a few atomic layers to form a controlled interfacial layer of non-ferroelectric material. If the non-ferroelectric layer is too thick, it could depolarize the ferroelectric layer, and the FTJ function cannot be produced. On the other hand, it is difficult to form a very thin interfacial layer in a controlled manner using related processes.

Some embodiments of this disclosure provide a method of forming the interfacial layer in a ferroelectric tunnel junction by controlling the nitrogen percentage in a nitrogen-containing electrode. In this case, an interfacial layer is formed due to oxygen scavenging from electrodes. The benefits provided by this method include the ability to form a controllable interfacial layer between an electrode and the ferroelectric layer and to selectively form the interfacial layer adjacent to one of electrodes to enhance the device performance of the ferroelectric tunnel junction. Further advantages of the method include compatibility with the CMOS process and cost saving by skipping a deposition step to control the interfacial layer with high precision requirements in the related process. The method and device structures are described below with reference to FIGS. 5-8.

FIG. 5 also shows the effect of the presence of the interfacial layer 540 on the band diagram of the ferroelectric tunnel junction 500. In FIG. 5, diagram 550 is an energy band diagram of ferroelectric tunnel junction 500 with a positive bias voltage on the first electrode 510. In FIG. 5, reference numeral 511 indicates the Fermi level of the first electrode 510, reference numeral 521 indicates the Fermi level of the second electrode 520, reference numeral 531 indicates the valence band edge of the ferroelectric layer 530, and reference numeral 532 indicates the conduction band edge of the ferroelectric layer 530. The polarization in the ferroelectric layer 530 produces charge dipoles 534. Reference numeral 541 indicates the valence band edge of the interfacial layer 540, and reference numeral 542 indicates the conduction band edge of the interfacial layer 540. The polarization in the ferroelectric layer 530 induces charge 544 in the interfacial layer 540. Further, charges 514 and 524 are induced in the first electrode 510 and the second electrode 520, respectively.

Diagram 550 shows band bending and an energy barrier 551 with a positive bias voltage on the first electrode 510. In contrast, diagram 560 is an energy band diagram of ferroelectric tunnel junction 500 with a positive bias voltage on the second electrode 520. The resultant energy barrier is shown as 561.

Figure 6:
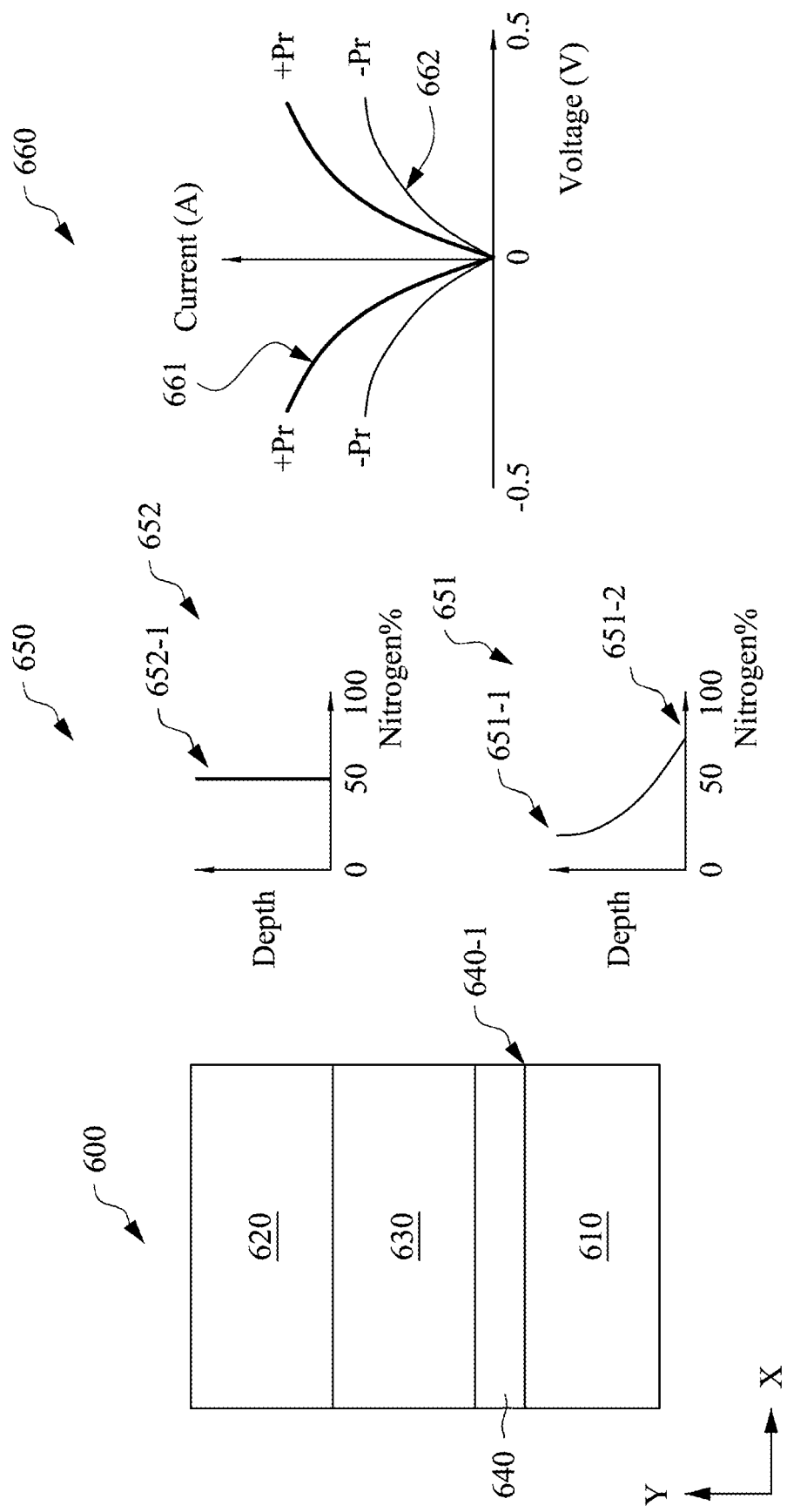
FIG. 6 illustrates another ferroelectric tunnel junction and its band diagram, in accordance with some embodiments.

FIG. 6 illustrates another ferroelectric tunnel junction and its band diagram, in accordance with some embodiments. As shown in FIG. 6, a ferroelectric tunnel junction (FTJ) 600 includes a first electrode 610, a ferroelectric layer 630 disposed over the first electrode 610, and a second electrode 620 disposed over the ferroelectric layer 630. The ferroelectric layer includes a ferroelectric material. Ferroelectric tunnel junction (FTJ) 600 also includes an interfacial layer 640 disposed on the first electrode 610, and the ferroelectric layer 630 is disposed on the interfacial layer 640. In some embodiments, the first electrode is also referred to as the bottom electrode (BE), and the second electrode 620 is also referred to as the top electrode (TE).

In some embodiments, ferroelectric tunnel junction (FTJ) 600 is similar to the ferroelectric tunnel junctions described above in connection with FIGS. 1-5 and can be formed using similar materials and processes described above. In FIG. 6, ferroelectric tunnel junction 600 includes a first nitrogen-containing electrode 610, characterized by a first nitrogen percentage, shown in diagram 651. Ferroelectric tunnel junction 600 also includes a ferroelectric layer 630 disposed over the first nitrogen-containing electrode 610, and the ferroelectric layer 630 includes one or more ferroelectric materials. Ferroelectric tunnel junction 600 also has a second nitrogen-containing electrode 620 disposed over the ferroelectric layer 630. The second nitrogen-containing electrode 620 is characterized by a second nitrogen percentage, shown in diagram 652.

In some embodiments, the first nitrogen-containing electrode 610 includes titanium nitride (TiN) or tantalum nitride (TaN), and the second nitrogen-containing electrode 620 also includes titanium nitride (TiN) or tantalum nitride (TaN). In some embodiments, the TiN is characterized by a percentage of nitrogen of 20%-65%. In some embodiments, TaN is characterized by a percentage of nitrogen of 40%-60%. The nitrogen-containing electrodes are not limited to TiN or TaN, and can include suitable metal nitrides or other nitrogen-containing conductors, or the combination thereof.

In FIG. 6, the presence of the interfacial layer 640 affects the band diagram of the ferroelectric tunnel junction 600, similarly to the description of the band diagrams of ferroelectric tunnel junction (FTJ) 500 in connection to FIG. 5.

In some embodiments, the interfacial layer 640 is formed during the process of forming the ferroelectric tunnel junction 600, due to the scavenging of oxygen from the ferroelectric layer 630 by the electrodes. In some embodiments, the first nitrogen percentage is less than the second nitrogen percentage, and the interfacial layer is formed between the first nitrogen-containing electrode 610 and the interfacial layer 640.

For example, as shown in diagram 650 in FIG. 6, the first nitrogen-containing electrode 610 is characterized by a graded nitrogen profile 651 that increases as it extends away from an interface 640-1 between the interfacial layer 640 and the first nitrogen-containing electrode 610, starting with a nitrogen percentage 651-1 at the interface 640-1 between the first interfacial layer and the first nitrogen-containing electrode 610 and reaches a higher nitrogen percentage 651-2 at the other surface of the first nitrogen-containing electrode 610. As shown in diagram 650, nitrogen percentage 651-1 is lower than the second nitrogen percentage 652-1 in the second nitrogen-containing electrode 620. In this example, nitrogen percentage 651-1 is about 20% and 651-2 is about 70%, and nitrogen percentage 652-1 is about 50%. However, other suitable percentages can also be used.

In FIG. 6, diagram 660 illustrates the magnitude of tunneling current versus applied voltage, in accordance with some disclosure. The band diagrams for ferroelectric tunnel junction 600 are similar to those for ferroelectric tunnel junction 500 in FIG. 5, where the ferroelectric layer 540 is located adjacent to the first electrode 510. In this case, the energy barrier 551 is lower than the energy barrier 561. As shown in diagram 660, the ferroelectric tunnel junction 600 shows larger tunneling current 661 when a positive remnant polarization +Pr is stored, and lower tunneling current 662 when a negative remnant polarization −Pr is stored. Thus, FIG. 6 illustrates an example of tuning the device performance of a ferroelectric tunnel junction by adjusting the nitrogen percentage in the nitrogen-containing electrodes.

Figure 7:
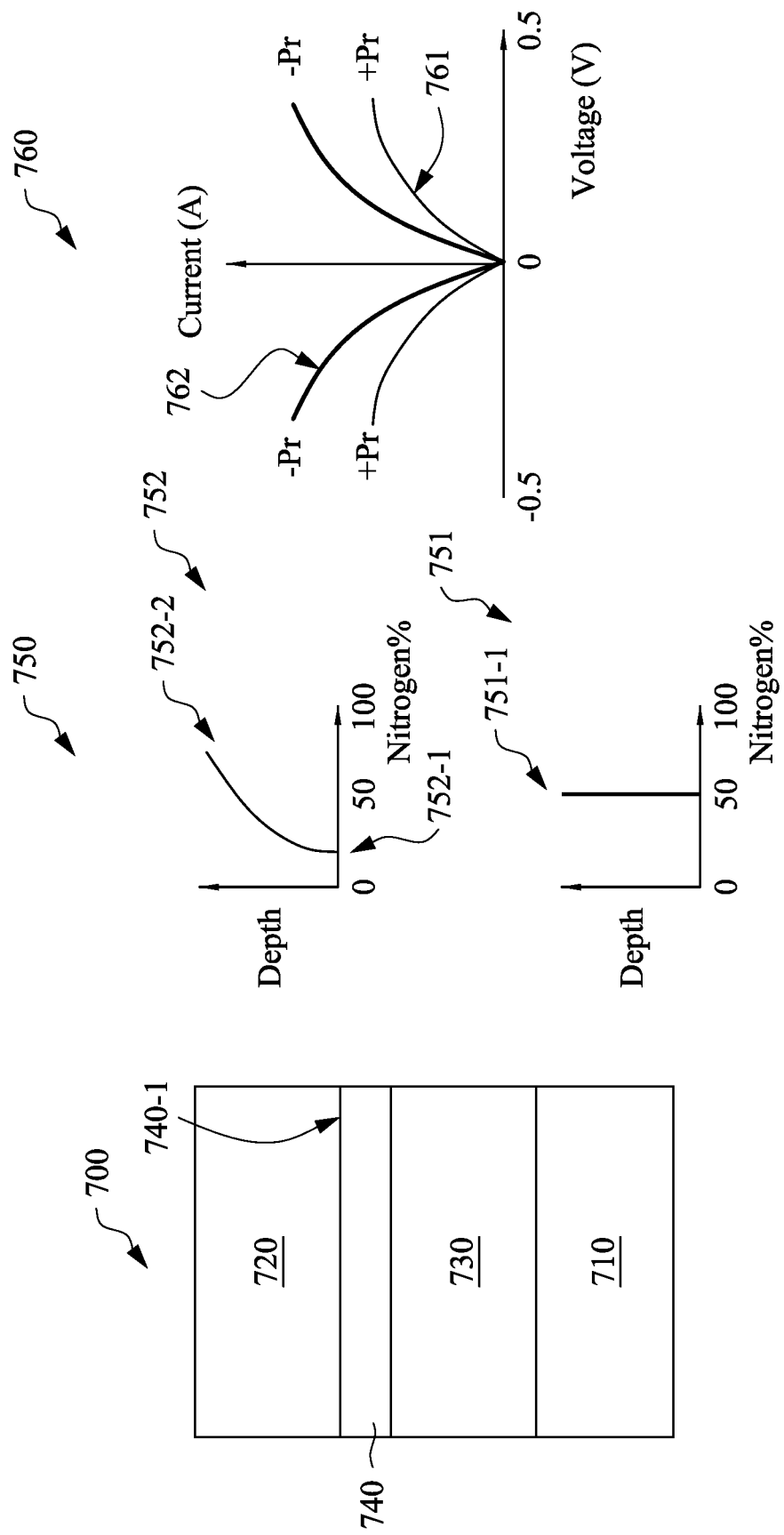
FIG. 7 illustrates another ferroelectric tunnel junction and its band diagram, in accordance with some embodiments.

FIG. 7 illustrates another ferroelectric tunnel junction and its band diagram, in accordance with some embodiments. As shown in FIG. 7, a ferroelectric tunnel junction (FTJ) 700 includes a first electrode 710, a ferroelectric layer 730 disposed over the first electrode 710, and a second electrode 720 disposed over the ferroelectric layer 730. The ferroelectric layer includes a ferroelectric material. Ferroelectric tunnel junction (FTJ) 700 also includes an interfacial layer 740 disposed on the ferroelectric layer 730, and the second electrode 720 is disposed on the interfacial layer 740. As noted above, the first electrode is also referred to as the bottom electrode (BE), and the second electrode 720 is also referred to as the top electrode (TE).

In some embodiments, ferroelectric tunnel junction (FTJ) 700 is similar to the ferroelectric tunnel junctions described above in connection with FIGS. 1-6 and can be formed using similar materials and processes described above. In FIG. 7, ferroelectric tunnel junction 700 includes a first nitrogen-containing electrode 710, characterized by a first nitrogen percentage, shown in diagram 751. Ferroelectric tunnel junction 700 also includes a ferroelectric layer 730 disposed over the first nitrogen-containing electrode 710, and the ferroelectric layer 730 includes one or more ferroelectric materials. Ferroelectric tunnel junction 700 also has a second nitrogen-containing electrode 720 disposed over the interfacial layer 740. The second nitrogen-containing electrode 720 is characterized by a second nitrogen percentage, shown in diagram 752.

In some embodiments, the first nitrogen-containing electrode 710 includes titanium nitride (TiN) or tantalum nitride (TaN), and the second nitrogen-containing electrode 720 also includes titanium nitride (TiN) or tantalum nitride (TaN). In some embodiments, the TiN is characterized by a percentage of nitrogen of 20%-65%. In some embodiments, TaN is characterized by a percentage of nitrogen of 40%-60%. The nitrogen-containing electrodes are not limited to TiN or TaN, and can include suitable metal nitrides or other nitrogen-containing conductors, or the combination thereof.

In FIG. 7, the presence of the interfacial layer 740 affects the band diagram of the ferroelectric tunnel junction 700, similarly to the description of the band diagrams of ferroelectric tunnel junction (FTJ) 500 in connection to FIG. 5, but with the positions of the ferroelectric layer 730 and the interfacial layer 740 interchanged.

In some embodiments, the interfacial layer 740 is formed during the process of forming the ferroelectric tunnel junction 700, due to the scavenging of oxygen from the ferroelectric layer 730 by the electrodes. In some embodiments, the first nitrogen percentage is higher than the second nitrogen percentage, and the interfacial layer is formed between the ferroelectric layer 730 and the second nitrogen-containing electrode 720.

For example, as shown in diagram 750 in FIG. 7, the second nitrogen-containing electrode 720 is characterized by a graded nitrogen profile 752 that increases as it extends away from an interface between the interfacial layer 740 and the second nitrogen-containing electrode 720, starting with a nitrogen percentage 752-1 at the interface 740-1 between the interfacial layer 740 and the second nitrogen-containing electrode 720 and reaches a higher nitrogen percentage 752-2 at the other surface of the second nitrogen-containing electrode 720. As shown in diagram 750, nitrogen percentage 752-1 is lower than the second nitrogen percentage 751-1 in the first nitrogen-containing electrode 710.

In FIG. 7, diagram 760 illustrates the magnitude of tunneling current versus applied voltage, in accordance with some disclosures. The band diagrams for ferroelectric tunnel junction 700 is similar to those for ferroelectric tunnel junction 500 in FIG. 5, with the locations of the interfacial layer and the ferroelectric layer interchanged. As shown in diagram 660, the ferroelectric tunnel junction 700 shows larger tunneling current 762 when negative remnant polarization −Pr is stored, and lower tunneling current 761 when a positive remnant polarization +Pr is stored. Thus, FIG. 7 illustrates another example of tuning the device performance of a ferroelectric tunnel junction by adjusting the nitrogen percentage in the nitrogen-containing electrodes.

Figure 8:
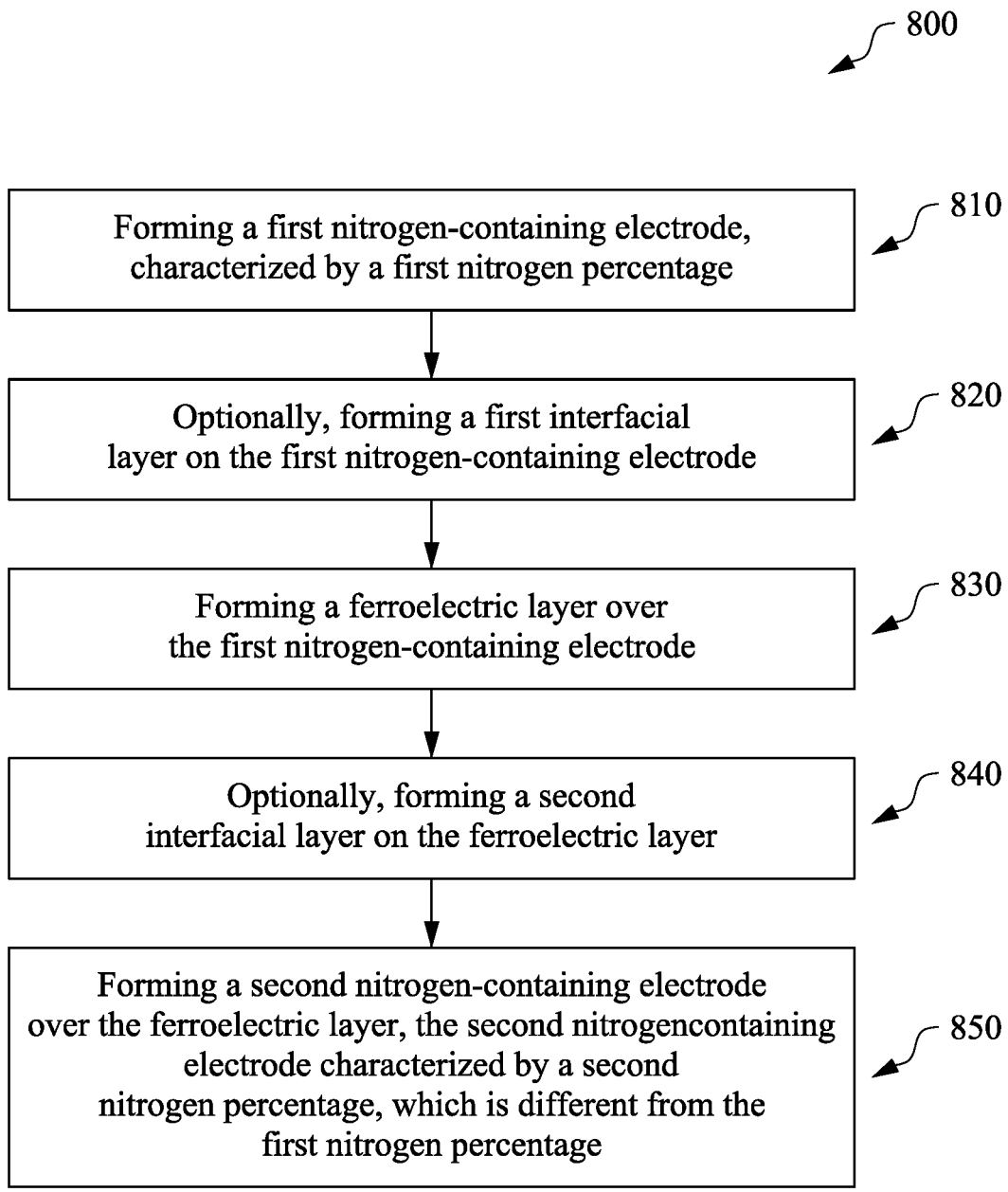
FIG. 8 is a flowchart illustrating a method for forming a semiconductor device, in accordance with some embodiments.

FIG. 8 is a flowchart illustrating a method for forming a semiconductor device, in accordance with some embodiments. As shown in FIG. 8, the method 800 includes a process for forming a ferroelectric tunnel junction (FTJ). The process includes:

At 810—forming a first nitrogen-containing electrode on a substrate, the first nitrogen-containing electrode characterized by a first nitrogen percentage;

At 820—optionally, forming a first interfacial layer on the first nitrogen-containing electrode;

At 830—forming a ferroelectric layer over the first nitrogen-containing electrode, the ferroelectric layer comprising a ferroelectric material;

At 840—optionally, forming a second interfacial layer on the ferroelectric layer; and At 850—forming a second nitrogen-containing electrode over the ferroelectric layer, the second nitrogen-containing electrode characterized by a second nitrogen percentage, wherein the first nitrogen percentage is different from the second nitrogen percentage.

The method 800 outlined above is described in connection to FIGS. 6-7. If, as shown in FIG. 6, the first nitrogen percentage 651 is less than the second nitrogen percentage 652, the method further includes forming an interfacial layer between the first nitrogen-containing electrode and the ferroelectric layer [630]. If, as shown in FIG. 7, the first nitrogen percentage is greater than the second nitrogen percentage [752], the method further includes forming an interfacial layer between the ferroelectric layer and the second nitrogen-containing electrode [720].

In some embodiments, both the first interfacial layer and the second interfacial layer are formed in the same ferroelectric tunnel junction. As noted above, the interfacial layer can include native oxide and/or chemical oxide, besides the oxides formed from oxygen scavenging by the nitrogen-containing electrodes. In some embodiments, the top electrode and the bottom electrodes are characterized by different oxygen percentages to create an asymmetrical charge screening effect at the two interfaces of the ferroelectric layer with the two nitrogen-containing electrodes. The presence of a non-polar material between the polar material and its neighboring electrode results in incomplete charge screening at the interface. The net charge and, hence, band bending and its resulting tunneling current, will change based on the polarization of the polar material. A thicker interfacial layer gives larger band bending and creates a larger difference between tunneling current at +Pr and −Pr cases. The upper boundary of the interfacial layer thickness is the depolarization field. In some embodiments, the thickness of the interfacial layer is controlled within 1 nm.

In some embodiments, as shown in FIG. 7, when the first nitrogen percentage is greater than the second nitrogen percentage, the first interfacial layer is thinner than the second interfacial layer. In this case, the tunneling current is higher with a negative remnant polarization −Pr than a positive remnant polarization +Pr. In other embodiments, as shown in FIG. 6, when the first nitrogen percentage is lower than the second nitrogen percentage, the first interfacial layer is thicker that the second interfacial layer. In this case, the tunneling current is higher with a positive remnant polarization +Pr than a negative remnant polarization −Pr. In some embodiments, an electrode with a lower nitrogen percentage will produce a thicker interfacial layer compared with the same electrode with a higher nitrogen percentage.

In some embodiments, the first nitrogen-containing electrode and the second nitrogen-containing electrode each includes titanium nitride (TiN) or tantalum nitride (TaN). In some embodiments, the TiN is characterized by a percentage of nitrogen of 20%-65%, and the TaN is characterized by a percentage of nitrogen of 40%-60%.

In some embodiments of method 800, the first nitrogen-containing electrode is characterized by a graded nitrogen profile that increases as it extends away from an interface between the first interfacial layer and the first nitrogen-containing electrode, starting with a nitrogen percentage at the interface between the first interfacial layer and the first nitrogen-containing electrode that is lower than the second nitrogen percentage in the second nitrogen-containing electrode.

In some other embodiments of method 800, the second nitrogen-containing electrode is characterized by a graded nitrogen profile that increases as it extends away from an interface between the second interfacial layer and the second nitrogen-containing electrode, starting with a nitrogen percentage at the interface between the second interfacial layer and the second nitrogen-containing electrode that is lower than the first nitrogen percentage in the first nitrogen-containing electrode.

In some embodiments, the nitrogen-containing electrode, such as TiN and TaN, is formed by sputtering or physical vapor deposition, using argon (Ar2) as the carrier stabilization gas and nitrogen (N2) as the reactive gas. The nitrogen percentage in the electrode can be varied by changing the flow rate of the nitrogen gas.

In some embodiments, the nitrogen percentage profiles can be uniform for both electrodes, with one lower than the other. However, a uniform low nitrogen profile through the thickness of the electrode is undesirable, because it may cause overly strong oxygen scavenging, leading to deterioration or breakdown of the ferroelectric material.

In some embodiments, as shown in FIG. 3, the method also includes forming a transistor having a gate region, drain region, and source region, and forming an interconnect structure to connect the ferroelectric tunnel junction to the drain region of the transistor to form a memory device.

In some embodiments, as shown in FIG. 2, the method also forms a transistor that includes: a source region, a drain region, a channel region disposed between the source region and the drain region, and a gate structure disposed on the channel region. The gate structure includes the ferroelectric tunnel junction described above and a gate metal layer disposed over the ferroelectric tunnel junction.

Additional embodiments provide methods and devices that vary the oxygen content of oxygen-containing electrodes to enhance the device performance of ferroelectric tunnel junctions. These embodiments are described below with reference to FIGS. 9-15

Figure 9:
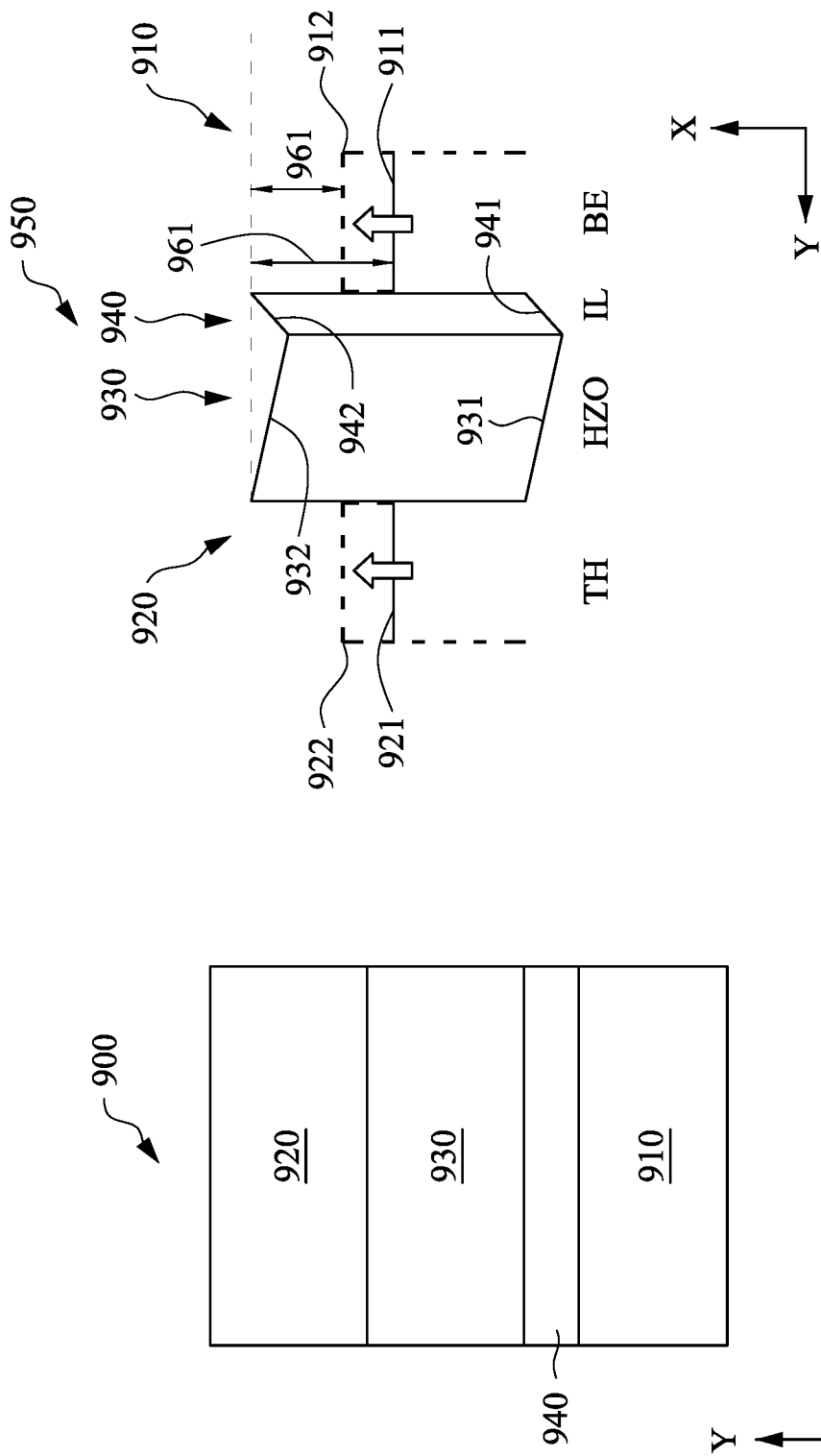
FIG. 9 illustrates another ferroelectric tunnel junction and its band diagram, in accordance with some embodiments.

FIG. 9 illustrates another ferroelectric tunnel junction and its band diagram, in accordance with some embodiments. As shown in FIG. 9, a ferroelectric tunnel junction (FTJ) 900 includes a first electrode 910, a ferroelectric layer 930 disposed over the first electrode 910, and a second electrode 920 disposed over the ferroelectric layer 930. The ferroelectric layer includes a ferroelectric material. Ferroelectric tunnel junction (FTJ) 900 also includes an interfacial layer 940 disposed on the first electrode 910, and the ferroelectric layer 930 is disposed on the interfacial layer 940. In some embodiments, the first electrode 910 is also referred to as the bottom electrode (BE), and the second electrode 920 is also referred to as the top electrode (TE).

In some embodiments, ferroelectric tunnel junction (FTJ) 900 is similar to the ferroelectric tunnel junctions 400-800 described above in connection with FIGS. 4-8. One difference is that in ferroelectric tunnel junction (FTJ) 900, the electrodes are oxygen-containing electrodes. One example of the oxygen-containing electrodes is the transparent conductive oxides, also referred to as TCO, for example, ZnO, $In_2O_3$, and $SnO_2$, AZO, TCO, and ITO, etc. These transparent conductive oxides have work functions from 3.0 eV to 5.4 eV, and their work functions can be varied by varying the oxygen content in the fabrication process.

In FIG. 9, diagram 950 is an energy band diagram of ferroelectric tunnel junction 900. In FIG. 9, reference numeral 911 indicates the Fermi level of the first electrode 910, reference numeral 921 indicates the Fermi level of the second electrode 920, reference numeral 931 indicates the valence band edge of the ferroelectric layer 930, and reference numeral 932 indicates the conduction band edge of the ferroelectric layer 930. Reference numeral 941 indicates the valence band edge of the interfacial layer 940, and reference numeral 942 indicates the conduction band edge of the interfacial layer 940.

Note that diagram 950 shows band bending and an energy barrier 961 determined by the work functions of the first electrode 910 and the second electrode 920. FIG. 9 also shows that if the work functions can be reduced, e.g., as indicated by Fermi levels 912 and 922, then the energy barrier 961 will become smaller, leading to higher tunneling current.

In some embodiments, the work function of the TCO electrode is adjusted by the oxygen content to enhance the tunneling current of the ferroelectric tunnel junction. FIG. 10 is a table illustrating possible oxygen profiles in a ferroelectric tunnel junction, depending on the location of the interfacial layer, in accordance with some embodiments. In FIG. 10, the interfacial layer is labeled "Non-polar layer." Four examples are shown.

Figure 11:
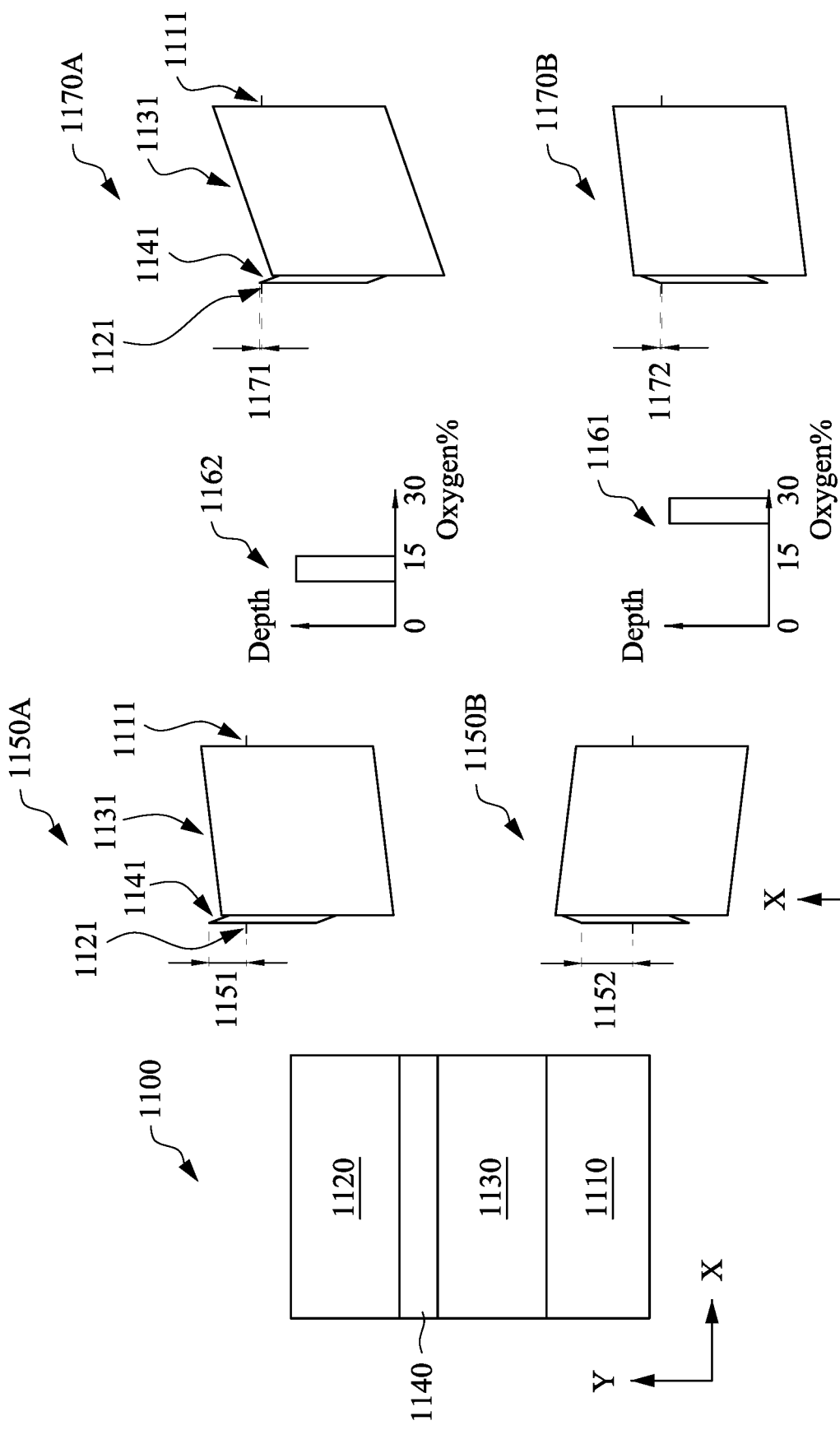
FIG. 11 illustrates another ferroelectric tunnel junction and its band diagram, in accordance with some embodiments.

Example 1: The interfacial layer is located adjacent to the top electrode, the oxygen content of the top electrode is 10%~15% and the oxygen content of the bottom electrode is 25%~30%. This example is illustrated in FIG. 11.

Figure 12:
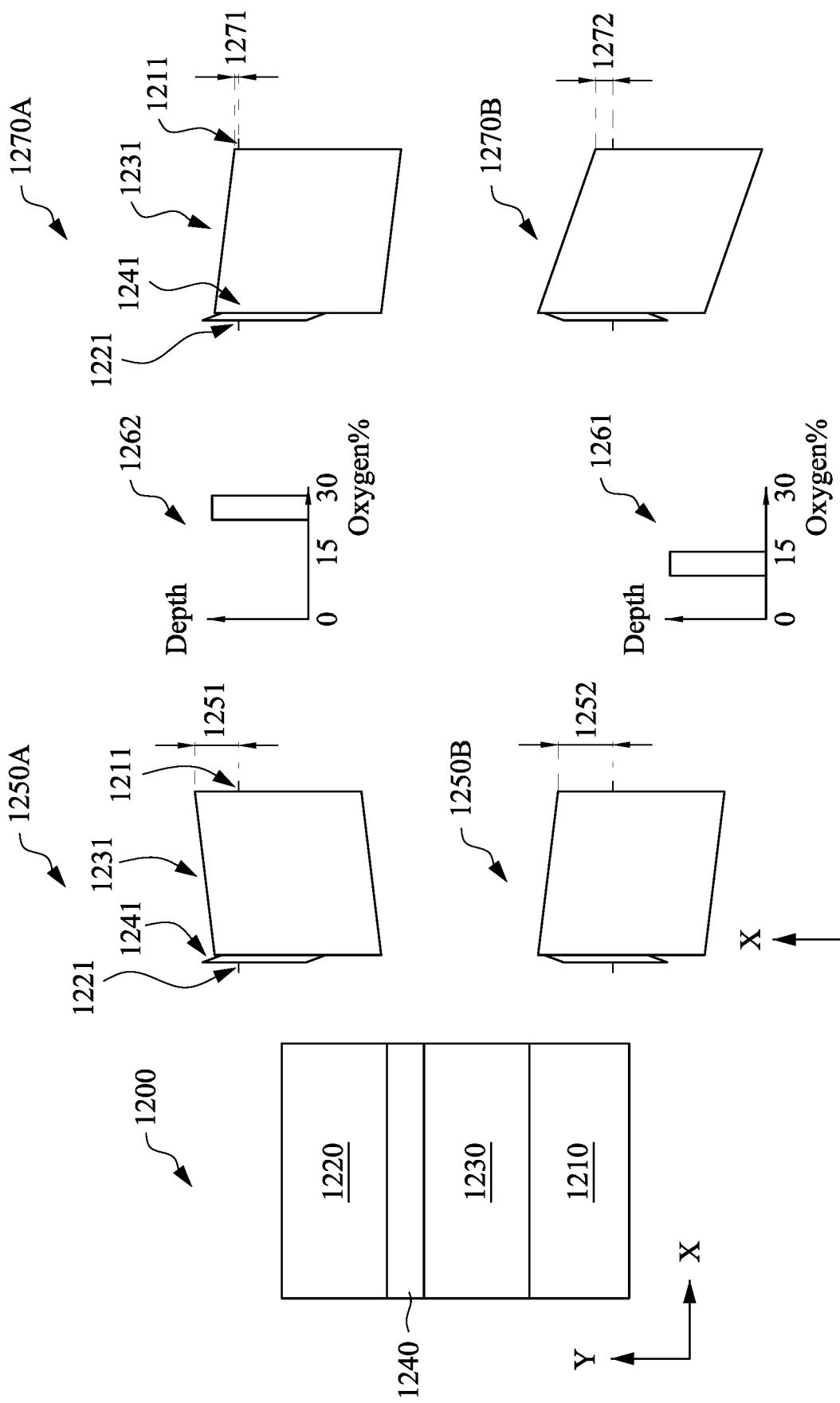
FIG. 12 illustrates another ferroelectric tunnel junction and its band diagram, in accordance with some embodiments.

Example 2: The interfacial layer is located adjacent to the top electrode, the oxygen content of the top electrode is 25%~30% and the oxygen content of the bottom electrode is 10%~15%. This example is illustrated in FIG. 12.

Figure 13:
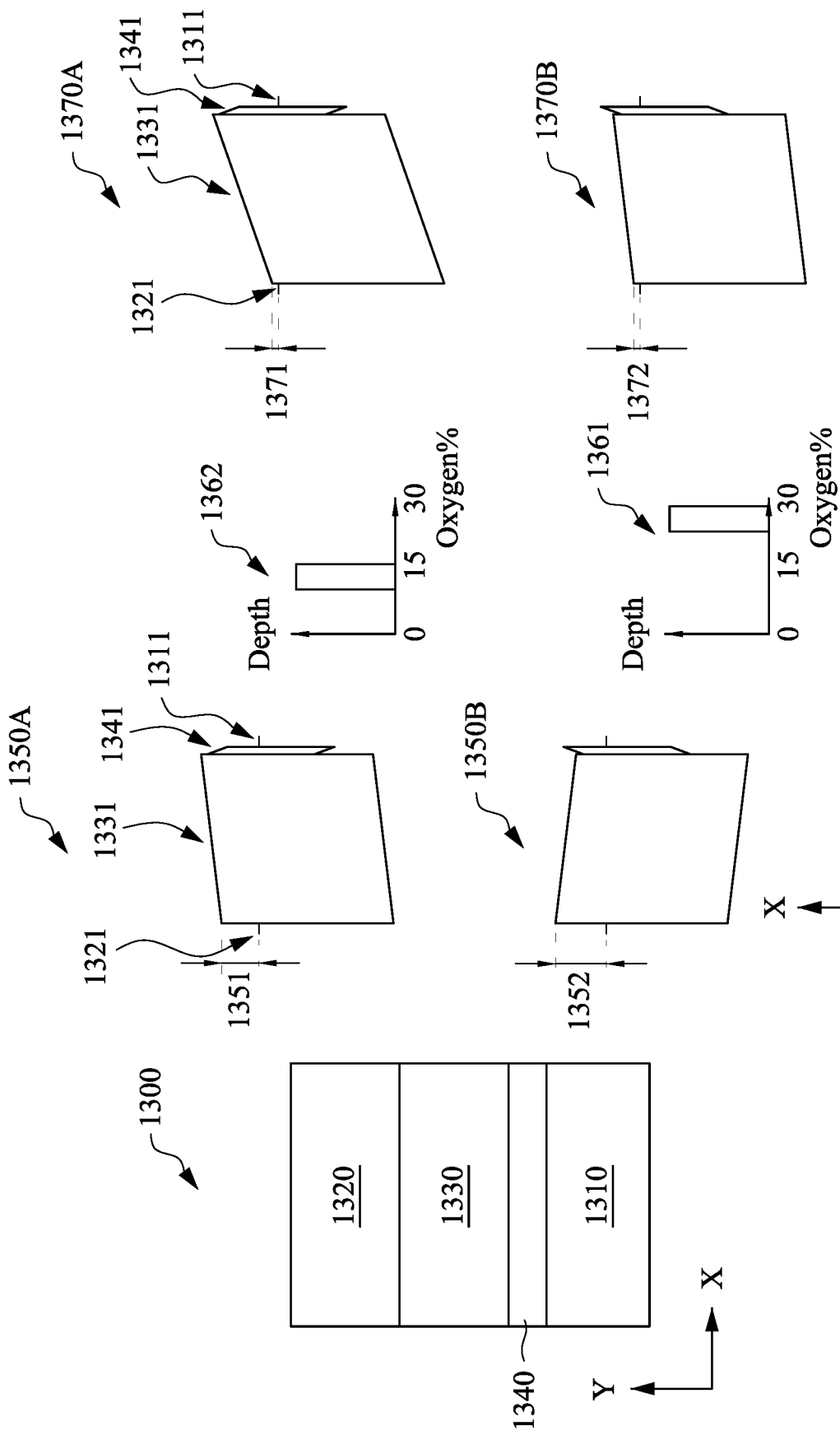
FIG. 13 illustrates another ferroelectric tunnel junction and its band diagram, in accordance with some embodiments.

Example 3: The interfacial layer is located adjacent to the bottom electrode, the oxygen content of the top electrode is 10%~15% and the oxygen content of the bottom electrode is 25%~30%. This example is illustrated in FIG. 13.

Figure 14:
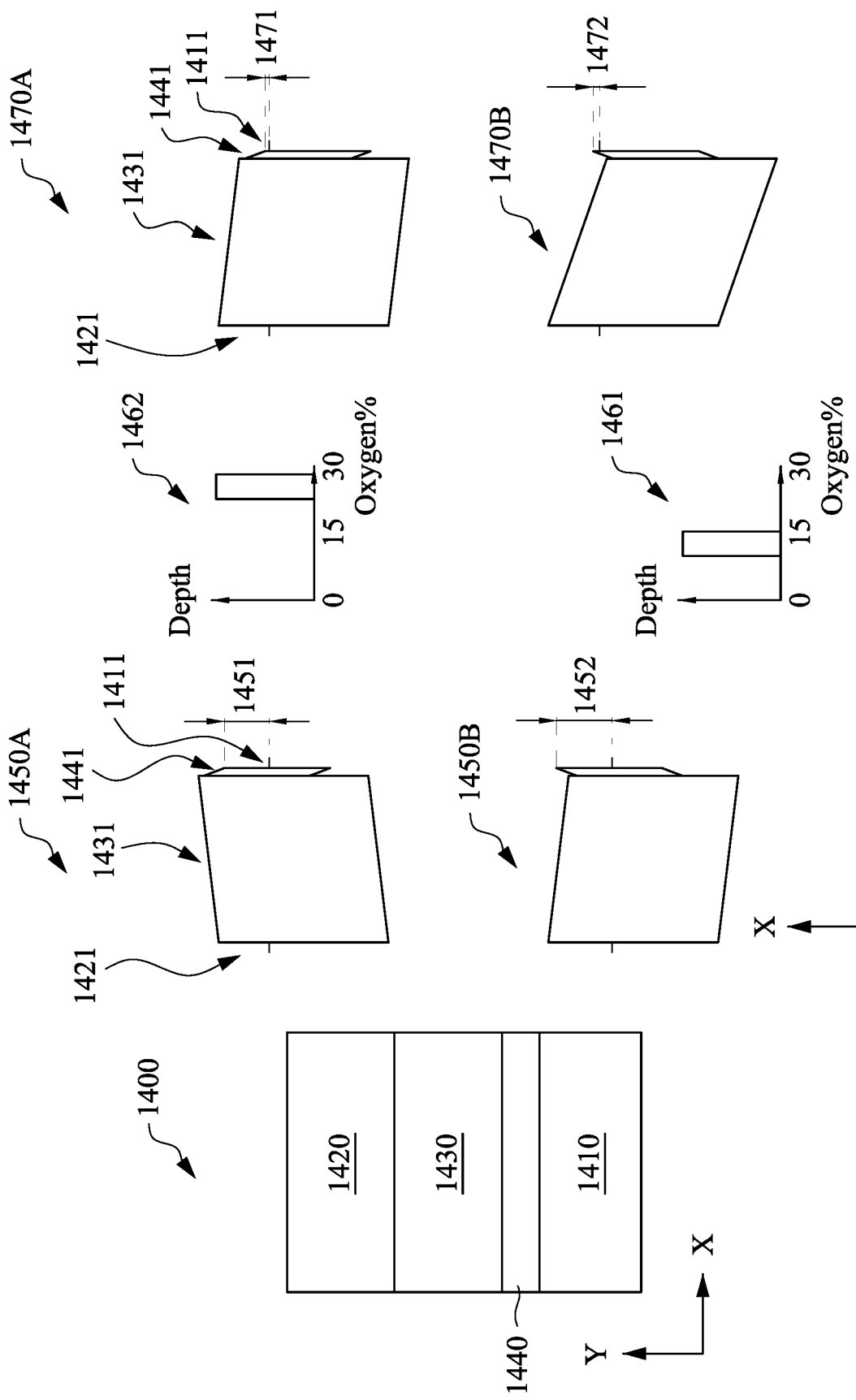
FIG. 14 illustrates another ferroelectric tunnel junction and its band diagrams, in accordance with some embodiments.

Example 4: The interfacial layer is located adjacent to the bottom electrode, the oxygen content of the top electrode is 25%~30% and the oxygen content of the bottom electrode is 10%~15%. This example is illustrated in FIG. 14.

FIG. 11 illustrates another ferroelectric tunnel junction and its band diagram, in accordance with some embodiments. As shown in FIG. 11, a ferroelectric tunnel junction (FTJ) 1100 includes a first electrode 1110, a ferroelectric layer 1130 disposed over the first electrode 1110, and a second electrode 1120 disposed over the ferroelectric layer 1130. The ferroelectric layer includes a ferroelectric material. Ferroelectric tunnel junction (FTJ) 1100 also includes an interfacial layer 1140 disposed on the ferroelectric layer 1130, and the second electrode 1120 is disposed on the interfacial layer 1140. In some embodiments, the first electrode 1110 is also referred to as the bottom electrode (BE), and the second electrode 1120 is also referred to as the top electrode (TE).

In the example of FIG. 11, the first electrode 1110 is an oxygen-containing electrode characterized by a first oxygen percentage, and the second electrode 1120 is an oxygen-containing electrode characterized by a second oxygen percentage. In this example, the oxygen-containing electrode is TCO. However, it is understood that the disclosure applies to other oxygen-containing electrodes as well.

Diagrams 1150A and 1150B illustrate the band diagrams for ferroelectric tunnel junction 1100 with a negative remnant polarization –Pr and a positive remnant polarization +Pr, respectively, when both electrodes are characterized by the same oxygen percentage, for example, 25%~30%. In diagram 1150A, with the ferroelectric tunnel junction 1100 with a negative remnant polarization –Pr, the label 1111 indicates the Fermi level of the first electrode 1110, the label 1121 indicates the Fermi level of the second electrode 1120, the label 1131 indicates the band diagram of the ferroelectric layer 1130, and the label 1141 indicates the band diagram of the interfacial layer 1140. In diagram 1150A, label 1151 indicates the work function of the second electrode 1120 with respect to the interfacial layer 1140. Similarly, diagram 1150B illustrates the band diagram for ferroelectric tunnel junction 1100 with a positive remnant polarization +Pr, and the label 1152 indicates the work function of the second electrode 1120 with respect to the interfacial layer 1140.

Next, the effect of different oxygen percentages in the electrodes are considered. The first electrode 1110 is characterized by a first oxygen percentage, for example, 25%~30%, as illustrated in diagram 1161. The second electrode 1120 is characterized by a second oxygen percentage, for example, 10%~15%, as illustrated in diagram 1162. Diagrams 1170A and 1170B illustrate the band diagram for ferroelectric tunnel junction 1100 with a negative remnant polarization –Pr and a positive remnant polarization +Pr, respectively. In diagram 1150A, with the ferroelectric tunnel junction 1100 with a negative remnant polarization –Pr, the label 1111 indicates the Fermi level of the first electrode 1110, the label 1121 indicates the Fermi level of the second electrode 1120, the label 1131 indicates the band diagram of the ferroelectric layer 1130, and the label 1141 indicates the band diagram of the interfacial layer 1140. In diagram 1170A, label 1171 indicates the work function of the second electrode 1120 with respect to the interfacial layer 1140. Similarly, diagram 1170B illustrates the band diagram for ferroelectric tunnel junction 1100 with a positive remnant polarization +Pr, and the label 1172 indicates the work function of the second electrode 1120 with respect to the interfacial layer 1140.

It can be seen that, when the interfacial layer 1140 is disposed adjacent to the second electrode 1120, and the second electrode 1120 has a lower oxygen percentage than the first electrode 1110, the work function of the second electrode 1120 is lowered. For example, the work function 1171 is lower than work function 1151, and work function 1172 is lower than work function 1152. As a result, the tunneling current level is enhanced for positive tunneling current under both negative remnant polarization −Pr and positive remnant polarization +Pr.

FIG. 12 illustrates another ferroelectric tunnel junction and its band diagram, in accordance with some embodiments. As shown in FIG. 12, a ferroelectric tunnel junction (FTJ) 1200 includes a first electrode 1210, a ferroelectric layer 1230 disposed over the first electrode 1210, and a second electrode 1220 disposed over the ferroelectric layer 1230. The ferroelectric layer includes a ferroelectric material. Ferroelectric tunnel junction (FTJ) 1200 also includes an interfacial layer 1240 disposed on the first electrode 1210, and the ferroelectric layer 1230 is disposed on the interfacial layer 1240. In some embodiments, the first electrode 1210 is also referred to as the bottom electrode (BE), and the second electrode 1220 is also referred to as the top electrode (TE).

In the example of FIG. 12, the first electrode 1210 is an oxygen-containing electrode characterized by a first oxygen percentage, and the second electrode 1220 is an oxygen-containing electrode characterized by a second oxygen percentage. In this example, the oxygen-containing electrode is TCO, although the disclosure applies to other oxygen-containing electrodes as well.

Diagrams 1250A and 1250B illustrate the band diagrams for ferroelectric tunnel junction 1200 with a negative remnant polarization −Pr and a positive remnant polarization +Pr, respectively, when both electrodes are characterized by the same oxygen percentage, for example, 25%~30%. In diagram 1250A, with the ferroelectric tunnel junction 1200 with a negative remnant polarization −Pr, the label 1211 indicates the Fermi level of the first electrode 1210, the label 1221 indicates the Fermi level of the second electrode 1220, 1231 indicates the band diagram of the ferroelectric layer 1230, and 1241 indicates the band diagram of the interfacial layer 1240. In diagram 1250A, label 1251 indicates the work function of the first electrode 1210 with respect to the interfacial layer 1240. Similarly, diagram 1250B illustrates the band diagram for ferroelectric tunnel junction 1200 with a positive remnant polarization +Pr, and the label 1252 indicates the work function of the first electrode 1210 with respect to the interfacial layer 1240.

Next, the effect of different oxygen percentages in the electrodes is considered. The first electrode 1210 is characterized by a first oxygen percentage, for example, 10%~15%, as illustrated in diagram 1261. The second electrode 1220 is characterized by a second oxygen percentage, for example, 25%~30%, as illustrated in diagram 1262. Diagrams 1270A and 1270B illustrate the band diagram for ferroelectric tunnel junction 1200 with a negative remnant polarization −Pr and a positive remnant polarization +Pr, respectively. In diagram 1270A, with the ferroelectric tunnel junction 1200 with a negative remnant polarization −Pr, the label 1211 indicates the Fermi level of the first electrode 1210, the label 1221 indicates the Fermi level of the second electrode 1220, the label 1231 indicates the band diagram of the ferroelectric layer 1230, and the label 1241 indicates the band diagram of the interfacial layer 1240. In diagram 1270A, label 1271 indicates the work function of the first electrode 1210 with respect to the interfacial layer 1240. Similarly, diagram 1270B illustrates the band diagram for ferroelectric tunnel junction 1200 with a positive remnant polarization +Pr, and the label 1272 indicates the work function of the first electrode 1210 with respect to the interfacial layer 1240.

It can be seen that, when the interfacial layer 1240 is disposed adjacent to the first electrode 1210, and the second electrode 1220 has a higher oxygen percentage than the first electrode 1210, the work function of the first electrode 1210 is lowered. For example, the work function 1271 is lower than work function 1251, and the work function 1272 is lower than work function 1252. As a result, the tunneling current level is enhanced for negative tunneling current under both negative remnant polarization −Pr and positive remnant polarization +Pr.

FIG. 13 illustrates another ferroelectric tunnel junction and its band diagram, in accordance with some embodiments. As shown in FIG. 13, a ferroelectric tunnel junction (FTJ) 1300 includes a first electrode 1310, a ferroelectric layer 1330 disposed over the first electrode 1310, and a second electrode 1320 disposed over the ferroelectric layer 1330. The ferroelectric layer includes a ferroelectric material. Ferroelectric tunnel junction (FTJ) 1300 also includes an interfacial layer 1340 disposed on the first electrode 1310, and the ferroelectric layer 1330 is disposed on the interfacial layer 1340. In some embodiments, the first electrode 1310 is also referred to as the bottom electrode (BE), and the second electrode 1320 is also referred to as the top electrode (TE).

In the example of FIG. 13, the first electrode 1310 is an oxygen-containing electrode characterized by a first oxygen percentage, and the second electrode 1320 is an oxygen-containing electrode characterized by a second oxygen percentage. In this example, the oxygen-containing electrode is TCO, although the disclosure applies to other oxygen-containing electrodes as well.

Diagrams 1350A and 1350B illustrate the band diagrams for ferroelectric tunnel junction 1300 with a negative remnant polarization −Pr and a positive remnant polarization +Pr, respectively, when both electrodes are characterized by the same oxygen percentage, for example, 25%~30%. In diagram 1350A, with the ferroelectric tunnel junction 1300 with a negative remnant polarization −Pr, the label 1311 indicates the Fermi level of the first electrode 1310, the label 1321 indicates the Fermi level of the second electrode 1320, the label 1331 indicates the band diagram of the ferroelectric layer 1330, and the label 1341 indicates the band diagram of the interfacial layer 1340. In diagram 1350A, label 1351 indicates the work function of the second electrode 1320 with respect to the ferroelectric layer 1330. Similarly, diagram 1350B illustrates the band diagram for ferroelectric tunnel junction 1300 with a positive remnant polarization +Pr, and the label 1352 indicates the work function of the second electrode 1320 with respect to the ferroelectric layer 1330.

Next, the effect of different oxygen percentages in the electrodes is considered. The first electrode 1310 is characterized by a first oxygen percentage, for example, 25%~30%, as illustrated in diagram 1361. The second electrode 1320 is characterized by a second oxygen percentage, for example, 10%~15%, as illustrated in diagram 1362. Diagrams 1370A and 1370B illustrate the band diagram for ferroelectric tunnel junction 1300 with a negative remnant polarization −Pr and a positive remnant polarization +Pr, respectively. In diagram 1350A, with the ferroelectric tunnel junction 1300 with a negative remnant polarization −Pr, the label 1311 indicates the Fermi level of the first electrode 1310, the label 1321 indicates the Fermi level of the second electrode 1320, the label 1331 indicates the band diagram of the ferroelectric layer 1330, and the label 1341 indicates the band diagram of the interfacial layer 1340. In diagram 1370A, label 1371 indicates the work function of the second electrode 1320 with respect to the ferroelectric layer 1330. Similarly, diagram 1170B illustrates the band diagram for ferroelectric tunnel junction 1300 with a positive remnant polarization +Pr, and the label 1372 indicates the work function of the second electrode 1320 with respect to the ferroelectric layer 1330.

It can be seen that, when the interfacial layer 1340 is disposed adjacent to the first electrode 1310, and the second electrode 1320 has a lower oxygen percentage than the first electrode 1310, the work function of the second electrode 1320 is lowered. For example, the work function 1371 is lower than work function 1351, and the work function 1372 is lower than work function 1352. As a result, the tunneling current level is enhanced for positive tunneling current under both negative remnant polarization −Pr and positive remnant polarization +Pr.

FIG. 14 illustrates another ferroelectric tunnel junction and its band diagrams, in accordance with some embodiments. As shown in FIG. 14, a ferroelectric tunnel junction (FTJ) 1400 includes a first electrode 1410, a ferroelectric layer 1430 disposed over the first electrode 1410, and a second electrode 1420 disposed over the ferroelectric layer 1430. The ferroelectric layer includes a ferroelectric material. Ferroelectric tunnel junction (FTJ) 1400 also includes an interfacial layer 1440 disposed on the first electrode 1410, and the ferroelectric layer 1430 is disposed on the interfacial layer 1440. In some embodiments, the first electrode 1410 is also referred to as the bottom electrode (BE), and the second electrode 1420 is also referred to as the top electrode (TE).

In the example of FIG. 14, the first electrode 1410 is an oxygen-containing electrode characterized by a first oxygen percentage, and the second electrode 1420 is an oxygen-containing electrode characterized by a second oxygen percentage. In this example, the oxygen-containing electrode is TCO, although the disclosure applies to other oxygen-containing electrodes as well.

Diagrams 1450A and 1450B illustrate the band diagrams for ferroelectric tunnel junction 1400 with a negative remnant polarization −Pr and a positive remnant polarization +Pr, respectively, when both electrodes are characterized by the same oxygen percentage, for example, 25%~30%. In diagram 1450A, with the ferroelectric tunnel junction 1400 with a negative remnant polarization −Pr, the label 1411 indicates the Fermi level of the first electrode 1410, the label 1421 indicates the Fermi level of the second electrode 1420, the label 1431 indicates the band diagram of the ferroelectric layer 1430, and the label 1441 indicates the band diagram of the interfacial layer 1440. In diagram 1450A, label 1451 indicates the work function of the first electrode 1410 with respect to the interfacial layer 1440. Similarly, diagram 1450B illustrates the band diagram for ferroelectric tunnel junction 1400 with a positive remnant polarization +Pr, and the label 1452 indicates the work function of the first electrode 1410 with respect to the interfacial layer 1440.

Next, the effect of different oxygen percentages in the electrodes are considered. The first electrode 1410 is characterized by a first oxygen percentage, for example, 25%~30%, as illustrated in diagram 1461. The second electrode 1420 is characterized by a second oxygen percentage, for example, 10%~15%, as illustrated in diagram 1462. Diagrams 1470A and 1470B illustrate the band diagram for ferroelectric tunnel junction 1400 with a negative remnant polarization −Pr and a positive remnant polarization +Pr, respectively. In diagram 1470A, with the ferroelectric tunnel junction 1400 with a negative remnant polarization −Pr, the label 1411 indicates the Fermi level of the first electrode 1410, the label 1421 indicates the Fermi level of the second electrode 1420, 1431 indicates the band diagram of the ferroelectric layer 1430, and 1441 indicates the band diagram of the interfacial layer 1440. In diagram 1470A, label 1471 indicates the work function of the first electrode 1410 with respect to the interfacial layer 1440. Similarly, diagram 1470B illustrates the band diagram for ferroelectric tunnel junction 1400 with a positive remnant polarization +Pr, and the label 1472 indicates the work function of the first electrode 1410 with respect to the interfacial layer 1440.

It can be seen that, when the interfacial layer 1440 is disposed adjacent to the first electrode 1410, and the second electrode 1420 has a lower oxygen percentage than the first electrode 1410, the work function of the first electrode 1410 is lowered. For example, the work function 1471 is lower than work function 1451, and the work function 1472 is lower than work function 1452. As a result, the tunneling current level is enhanced for negative tunneling current under both negative remnant polarization −Pr and positive remnant polarization +Pr.

Figure 15:
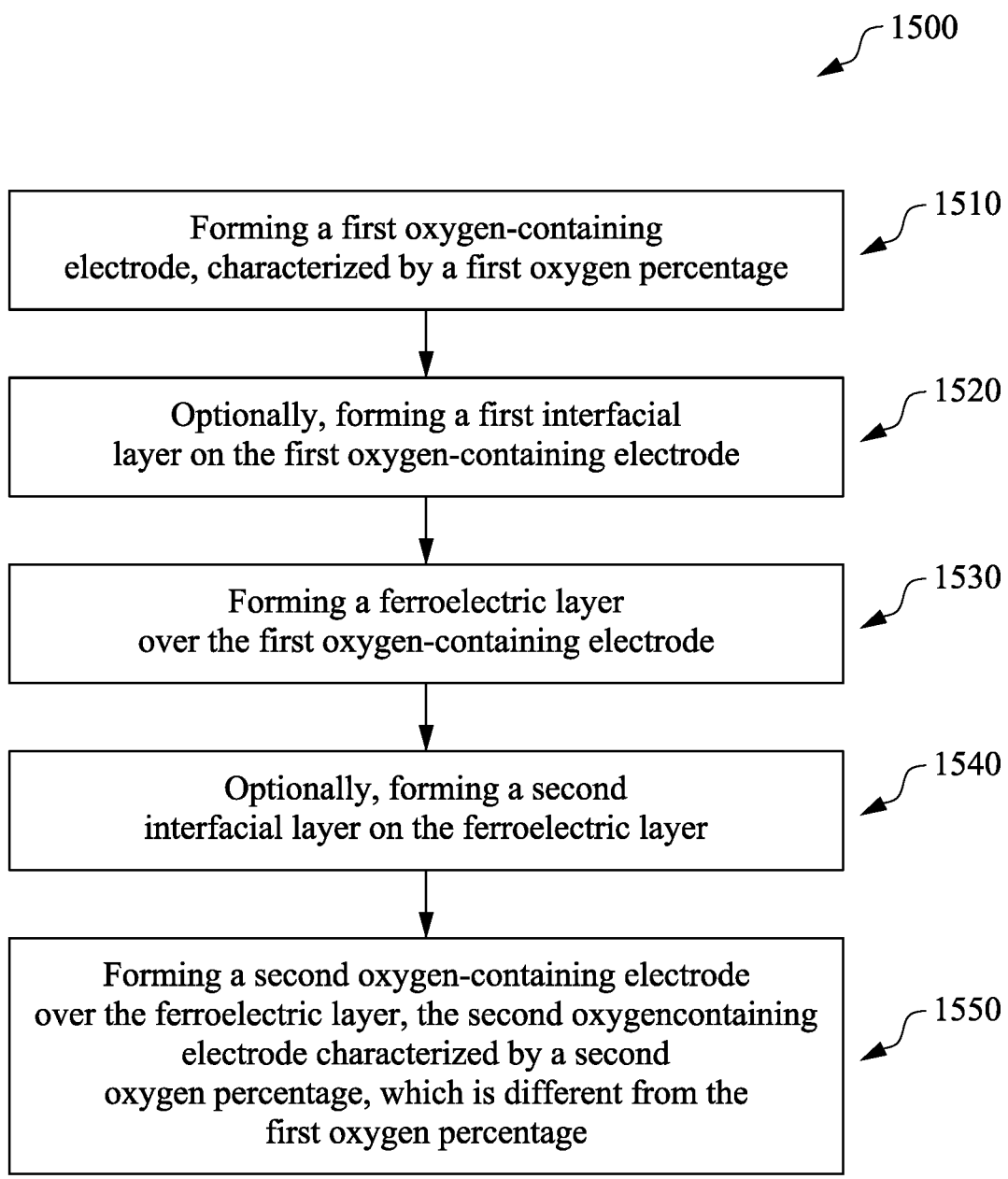
FIG. 15 is a flowchart illustrating a method for forming a semiconductor device, in accordance with some embodiments.

FIG. 15 is a flowchart illustrating a method for forming a semiconductor device, in accordance with some embodiments. As shown in FIG. 15, the method 1500 includes a process for forming a ferroelectric tunnel junction (FTJ). The process includes:

- At 1510—forming a first oxygen-containing electrode, characterized by a first oxygen percentage;
- At 1520—optionally, forming a first interfacial layer on the first oxygen-containing electrode;
- At 1530—forming a ferroelectric layer disposed over the first oxygen-containing electrode, the ferroelectric layer comprising a ferroelectric material;
- At 1540—optionally, forming a second interfacial layer on the ferroelectric layer; and
- At 1550—forming a second oxygen-containing electrode disposed over the ferroelectric layer, and characterized by a second oxygen percentage; wherein the first oxygen percentage is different from the second oxygen percentage.

In some embodiments, the method includes forming a FTJ with enhanced positive tunneling current under −Pr and +Pr by forming a first interfacial layer between the first oxygen-containing electrode and the ferroelectric layer and a second interfacial layer between the ferroelectric layer and the second oxygen-containing electrode. In some embodiments the first oxygen percentage is 25%-30%, and the second oxygen percentage is 10%-15%.

In some embodiments, the method includes forming a FTJ with enhanced negative tunneling current under −Pr and +Pr by forming a first interfacial layer between the first oxygen-containing electrode and the ferroelectric layer and a second interfacial layer between the ferroelectric layer and the second oxygen-containing electrode. In some embodiments, the first oxygen percentage is 10%-15% and the second oxygen percentage is 25%-30%.

Embodiments of the disclosure provide a semiconductor device including a ferroelectric tunnel junction (FTJ), wherein the ferroelectric tunnel junction includes a first electrode, a ferroelectric layer disposed over the first electrode, and a second electrode disposed over the ferroelectric layer. The first electrode contains nitrogen or oxygen and is characterized by a first percentage of nitrogen or oxygen.

The second electrode contains nitrogen or oxygen and is characterized by a second percentage of nitrogen or oxygen. The first percentage is different from the second percentage. The percentage of nitrogen or oxygen is adjusted to enhance the device performance of the ferroelectric tunnel junction. In some embodiments, varying the percentage of nitrogen in nitrogen-containing electrodes can lead to different thickness of interfacial layers adjacent to each electrode, resulting in band bending that enhances tunneling current. In some other embodiments, varying the percentage of oxygen in oxygen-containing electrodes can lead to different work functions of each electrode, resulting in enhancement of tunneling current.

In some embodiments, a semiconductor device includes a ferroelectric tunnel junction (FTJ), which includes a first nitrogen-containing electrode, characterized by a first nitrogen percentage; a ferroelectric layer disposed over the first nitrogen-containing electrode, and a second nitrogen-containing electrode disposed over the ferroelectric layer, the second nitrogen-containing electrode characterized by a second nitrogen percentage. The first nitrogen percentage is different from the second nitrogen percentage.

In some embodiments, a method for forming a semiconductor device includes forming a ferroelectric tunnel junction (FTJ). The process of forming the ferroelectric tunnel junction includes forming a first nitrogen-containing electrode on a substrate, the first nitrogen-containing electrode characterized by a first nitrogen percentage, and optionally, forming a first interfacial layer on the first nitrogen-containing electrode. The method also includes forming a ferroelectric layer over the first nitrogen-containing electrode, and optionally, forming a second interfacial layer on the ferroelectric layer. The method further includes forming a second nitrogen-containing electrode over the ferroelectric layer, the second nitrogen-containing electrode characterized by a second nitrogen percentage. The first nitrogen percentage is different from the second nitrogen percentage. If the first nitrogen percentage is less than the second nitrogen percentage, the method further includes forming the first interfacial layer between the first nitrogen-containing electrode and the ferroelectric layer. If the first nitrogen percentage is greater than the second nitrogen percentage, the method further includes forming the second interfacial layer between the ferroelectric layer and the second nitrogen-containing electrode.

In some embodiments, a method for forming a semiconductor device includes forming a ferroelectric tunnel junction (FTJ). The process of forming the ferroelectric tunnel junction includes forming a first nitrogen-containing electrode on a substrate, the first nitrogen-containing electrode characterized by a first nitrogen percentage. The method also includes forming a ferroelectric layer over the first nitrogen-containing electrode. The method further includes forming a second nitrogen-containing electrode over the ferroelectric layer, the second nitrogen-containing electrode characterized by a second nitrogen percentage. The first nitrogen percentage is different from the second nitrogen percentage. When the first nitrogen percentage is less than the second nitrogen percentage, the method further includes forming a first interfacial layer between the first nitrogen-containing electrode and the ferroelectric layer. When the first nitrogen percentage is greater than the second nitrogen percentage, the method further includes forming a second interfacial layer between the ferroelectric layer and the second nitrogen-containing electrode.

In some embodiments, a semiconductor device includes a ferroelectric tunnel junction (FTJ), which includes a first oxygen-containing electrode characterized by a first oxygen percentage, a ferroelectric layer disposed over the first oxygen-containing electrode, and a second oxygen-containing electrode disposed over the ferroelectric layer, and characterized by a second oxygen percentage, which is different from the first oxygen percentage.

In some embodiments, a method for forming a semiconductor device includes a process for forming a ferroelectric tunnel junction (FTJ). The process includes forming a first oxygen-containing electrode, characterized by a first oxygen percentage, and optionally, forming a first interfacial layer on the first oxygen-containing electrode. The process also includes forming a ferroelectric layer disposed over the first oxygen-containing electrode, and optionally, forming a second interfacial layer on the ferroelectric layer. The process further includes forming a second oxygen-containing electrode disposed over the ferroelectric layer, and characterized by a second oxygen percentage. The first oxygen percentage is different from the second oxygen percentage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a ferroelectric tunnel junction (FTJ), wherein the ferroelectric tunnel junction comprises:
   a first nitrogen-containing electrode, characterized by a first nitrogen percentage;
   a ferroelectric layer disposed over the first nitrogen-containing electrode, the ferroelectric layer comprising a ferroelectric material; and
   a second nitrogen-containing electrode disposed over the ferroelectric layer, the second nitrogen-containing electrode characterized by a second nitrogen percentage; and
   wherein the first nitrogen percentage is different from the second nitrogen percentage.

2. The semiconductor device of claim 1, wherein the first nitrogen-containing electrode comprises titanium nitride (TiN) or tantalum nitride (TaN), and wherein the second nitrogen-containing electrode comprises titanium nitride (TiN) or tantalum nitride (TaN).

3. The semiconductor device of claim 2, wherein the titanium nitride is characterized by a percentage of nitrogen of 20%-65%.

4. The semiconductor device of claim 2, wherein the tantalum nitride is characterized by a percentage of nitrogen of 40%-60%.

5. The semiconductor device of claim 1, wherein the first nitrogen percentage is less than the second nitrogen percentage, and the ferroelectric tunnel junction further comprises an interfacial layer between the first nitrogen-containing electrode and the ferroelectric layer.

6. The semiconductor device of claim 5, wherein the first nitrogen-containing electrode is characterized by a graded nitrogen profile that increases as it extends away from an interface between the first interfacial layer and the first nitrogen-containing electrode, starting with a nitrogen percentage at the interface between the first interfacial layer and the first nitrogen-containing electrode that is lower than the second nitrogen percentage in the second nitrogen-containing electrode.

7. The semiconductor device of claim 5, wherein the first nitrogen percentage is greater than the second nitrogen percentage, and the ferroelectric tunnel junction further comprises an interfacial layer between the ferroelectric layer and the first nitrogen-containing electrode.

8. The semiconductor device of claim 7, wherein the second nitrogen-containing electrode is characterized by a graded nitrogen profile that increases as it extends away from an interface between the second interfacial layer and the second nitrogen-containing electrode, starting with a nitrogen percentage at the interface between the second interfacial layer and the second nitrogen-containing electrode that is lower than the first nitrogen percentage in the first nitrogen-containing electrode.

9. The semiconductor device of claim 1, further comprising a transistor having a gate region, drain region, and source region;
wherein the ferroelectric tunnel junction is connected to the drain region of the transistor to form a memory device.

10. The semiconductor device of claim 1, further comprising a transistor that includes:
a source region;
a drain region;
a channel region disposed between the source region and the drain region; and
a gate structure disposed on the channel region, wherein the gate structure includes:
the ferroelectric tunnel junction; and
a gate metal layer disposed over the ferroelectric tunnel junction.

11. A semiconductor device, comprising:
a ferroelectric tunnel junction (FTJ), wherein the ferroelectric tunnel junction comprises:
a first oxygen-containing electrode, characterized by a first oxygen percentage;
a ferroelectric layer disposed over the first oxygen-containing electrode, the ferroelectric layer comprising a ferroelectric material; and
a second oxygen-containing electrode disposed over the ferroelectric layer, and characterized by a second oxygen percentage;
wherein the first oxygen percentage is different from the second oxygen percentage.

12. The semiconductor device of claim 11, further comprising a first interfacial layer between the first oxygen-containing electrode and the ferroelectric layer, and wherein first oxygen percentage is between 25%-30%, and the second oxygen percentage is between 10%-15%.

13. The semiconductor device of claim 11, further comprising a first interfacial layer between the first oxygen-containing electrode and the ferroelectric layer, and wherein first oxygen percentage is between 10%-15% and the second oxygen percentage is between 25%-30%.

14. The semiconductor device of claim 11, further comprising a second interfacial layer between the ferroelectric layer and the second oxygen-containing electrode, and wherein first oxygen percentage is 25%-30%, and the second oxygen percentage is 10%-15%.

15. The semiconductor device of claim 11, further comprising a second interfacial layer between the ferroelectric layer and the second oxygen-containing electrode, and wherein first oxygen percentage is 10%-15% and the second oxygen percentage is 25%-30%.

16. A semiconductor device, comprising:
a substrate:
a ferroelectric tunnel junction (FTJ) disposed on the substrate, wherein the ferroelectric tunnel junction comprises:
a first nitrogen-containing electrode characterized by a first nitrogen percentage;
a ferroelectric layer disposed over the first nitrogen-containing electrode, the ferroelectric layer comprising a ferroelectric material; and
a second nitrogen-containing electrode disposed over the ferroelectric layer, wherein the second nitrogen-containing electrode is characterized by a second nitrogen percentage different from the first nitrogen percentage.

17. The semiconductor device of claim 16, wherein the first nitrogen-containing electrode comprises titanium nitride (TiN) or tantalum nitride (TaN), and wherein the second nitrogen-containing electrode comprises titanium nitride (TiN) or tantalum nitride (TaN).

18. The semiconductor device of claim 17, wherein the titanium nitride is characterized by a percentage of nitrogen of 20%-65%.

19. The semiconductor device of claim 17, wherein the tantalum nitride is characterized by a percentage of nitrogen of 40%-60%.

20. The semiconductor device of claim 16, wherein the first nitrogen percentage is less than the second nitrogen percentage, and the ferroelectric tunnel junction further comprises an interfacial layer between the first nitrogen-containing electrode and the ferroelectric layer.

* * * * *